(12) United States Patent
Tsuboi et al.

(10) Patent No.: US 9,581,621 B2
(45) Date of Patent: Feb. 28, 2017

(54) METHOD OF CALCULATING CURRENT CORRECTION FORMULA FOR POWER STRIP, CURRENT MEASURING METHOD, AND POWER STRIP

(71) Applicant: FUJITSU LIMITED, Kawasaki-shi, Kanagawa (JP)

(72) Inventors: Osamu Tsuboi, Kawasaki (JP); Hiromitsu Soneda, Kawasaki (JP); Fumihiko Nakazawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 930 days.

(21) Appl. No.: 13/667,213

(22) Filed: Nov. 2, 2012

(65) Prior Publication Data

US 2013/0060494 A1 Mar. 7, 2013

Related U.S. Application Data

(63) Continuation of application No. PCT/JP2011/058642, filed on Apr. 5, 2011.

(30) Foreign Application Priority Data

May 25, 2010 (JP) ................. 2010-119850

(51) Int. Cl.
*G01R 19/00* (2006.01)
*G01R 15/20* (2006.01)
*G01R 21/06* (2006.01)

(52) U.S. Cl.
CPC ....... *G01R 19/0092* (2013.01); *G01R 15/202* (2013.01); *G01R 21/06* (2013.01)

(58) Field of Classification Search
CPC .. G01R 15/202; G01R 19/0092; G01R 21/06; G08B 21/00

(Continued)

(56) References Cited

U.S. PATENT DOCUMENTS

| 5,650,771 A | * | 7/1997 | Lee | .......................... G01R 15/12 340/538.17 |
| 2002/0014971 A1 | * | 2/2002 | Ferraro | .............. G08B 13/1409 340/689 |

(Continued)

FOREIGN PATENT DOCUMENTS

| CN | 1997899 A | 7/2007 |
| EP | 1096261 A2 | 5/2001 |

(Continued)

OTHER PUBLICATIONS

Office Action dated Oct. 8, 2014. Application No. 201180024221.7.

(Continued)

*Primary Examiner* — Toan Le
*Assistant Examiner* — Eyob Hagos
(74) *Attorney, Agent, or Firm* — Kratz, Quintos & Hanson, LLP

(57) ABSTRACT

A method of calculating a current correction formula may include first measuring voltage values at each of current measuring parts configured to measure currents in socket parts of a power strip in a state in which no current flows in the socket parts, second measuring the voltage values at each of the current measuring parts in a state in which a current flows in one of the socket parts, and calculating a correction formula formed by a inverse matrix of a matrix having as its elements differences between the voltage values measured by the second measuring and the voltage values measured by the first measuring.

5 Claims, 16 Drawing Sheets

(58) Field of Classification Search
USPC .......................................................... 702/60
See application file for complete search history.

(56) References Cited

U.S. PATENT DOCUMENTS

| | | | | |
|---|---|---|---|---|
| 2007/0085518 A1* | 4/2007 | Buda | ................... | B23K 11/241 |
| | | | | 323/281 |
| 2007/0262646 A1 | 11/2007 | Lee | | |
| 2008/0094210 A1* | 4/2008 | Paradiso | ............. | H04L 12/2827 |
| | | | | 340/540 |
| 2008/0148075 A1 | 6/2008 | Reder | | |
| 2008/0312854 A1* | 12/2008 | Chemin | ............... | G01R 15/202 |
| | | | | 702/64 |

FOREIGN PATENT DOCUMENTS

| | | | |
|---|---|---|---|
| JP | H7-240259 | | 9/1995 |
| JP | 2000-221218 | | 8/2000 |
| JP | 2000221218 A | * | 8/2000 |
| JP | 2002-98715 A1 | | 4/2002 |
| JP | 2007-522634 A1 | | 8/2007 |
| JP | 2008-504546 A1 | | 2/2008 |
| WO | 2006010865 A1 | | 2/2006 |

OTHER PUBLICATIONS

International Search Report for International Application No. PCT/JP2011/058642 dated Jul. 12, 2011.
Extended European Search Report mailed on Jan. 29, 2016 issued with respect to the corresponding European Patent Application No. 11786420.7.

* cited by examiner

FIG.8

$$\begin{bmatrix} I1 \\ I2 \\ I3 \\ I4 \end{bmatrix} = \underbrace{\begin{bmatrix} (V11-V10), (V12-V10), (V13-V10), (V14-V10) \\ (V21-V20), \mathbf{(V22-V20)}, (V23-V20), (V24-V20) \\ (V31-V30), (V32-V30), \mathbf{(V33-V30)}, (V34-V30) \\ (V41-V40), (V42-V40), (V43-V40), \mathbf{(V44-V40)} \end{bmatrix}^{-1}}_{P2} \underbrace{\begin{bmatrix} (V1-V10)*I \\ (V2-V20)*I \\ (V3-V30)*I \\ (V4-V40)*I \end{bmatrix}}_{P1}$$

US 9,581,621 B2

METHOD OF CALCULATING CURRENT CORRECTION FORMULA FOR POWER STRIP, CURRENT MEASURING METHOD, AND POWER STRIP

CROSS-REFERENCE TO RELATED APPLICATIONS

This application is a continuation application of International Application No. PCT/JP2011/058642 filed on Apr. 5, 2011 and designated the U.S., which is based upon and claims the benefit of priority of the prior Japanese Patent Application No. 2010-119850, filed on May 25, 2010, the entire contents of which are incorporated herein by reference.

FIELD

The embodiments discussed herein are related to a method of calculating a current correction formula for a power strip, a current measuring method, a power measuring method, a manufacturing method, a power strip, and a current measuring system.

BACKGROUND

The power strip may be used to supply power in homes, offices, and the like. The power strip includes sockets for connecting to a plurality of electrical apparatuses and the like, and may supply power to each of the electrical apparatuses connected to the sockets.

On the other hand, in recent years, there are demands to reduce the power consumption in consideration of the increase in power demands and the global environment. One example of the measures to reduce the power consumption requires the power consumed by each of the electrical apparatuses to be known. That is, by knowing the power consumption and the state of use of each of the electrical apparatuses, the arrangement and the like of the electrical apparatuses may be optimized in order to reduce the power consumption.

Examples of the prior art include Japanese Laid-Open Patent Publication No. 2007-522634, Japanese Laid-Open Patent Publication No. 7-240259, and Japanese Laid-Open Patent Publication No. 2002-98715.

The power strip receives power from a single socket, and supplies power to each of the electrical apparatuses connected to the sockets of the power strip. For this reason, the power strip is unable to know the power consumption of each of the electrical apparatuses connected thereto. For example, according to a method proposed in a Patent Document 3, the current flowing through the entire power strip may be detected in order to calculate the power consumption. However, it is impossible to separately know the power consumption of each of the electrical apparatuses and the like connected to the sockets of the power strip.

For this reason, there are demands for a power strip that may separately know the power consumption of each of the electrical apparatuses and the like connected to the power strip. More particularly, there are demands for a method of calculating a current correction formula for the power strip, a current measuring method, a power measuring method, a manufacturing method, the power strip, and a current measuring system that may enable accurate measurement of the power consumption of each electrical apparatus and the like using the power strip.

SUMMARY

According to one aspect of the present invention, a method of calculating a current correction formula may include first measuring voltage values at each of a plurality of current measuring parts configured to measure currents in a plurality of socket parts of a power strip in a state in which no current flows in the plurality of socket parts of the power strip; second measuring the voltage values at each of the plurality of current measuring parts in a state in which a current flows in one of the plurality of socket parts; and calculating a correction formula formed by a inverse matrix of a matrix having as its elements differences between the voltage values measured by the second measuring and the voltage values measured by the first measuring.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram for explaining the current measuring method in the first embodiment;

DESCRIPTION OF EMBODIMENTS

Figure 1:
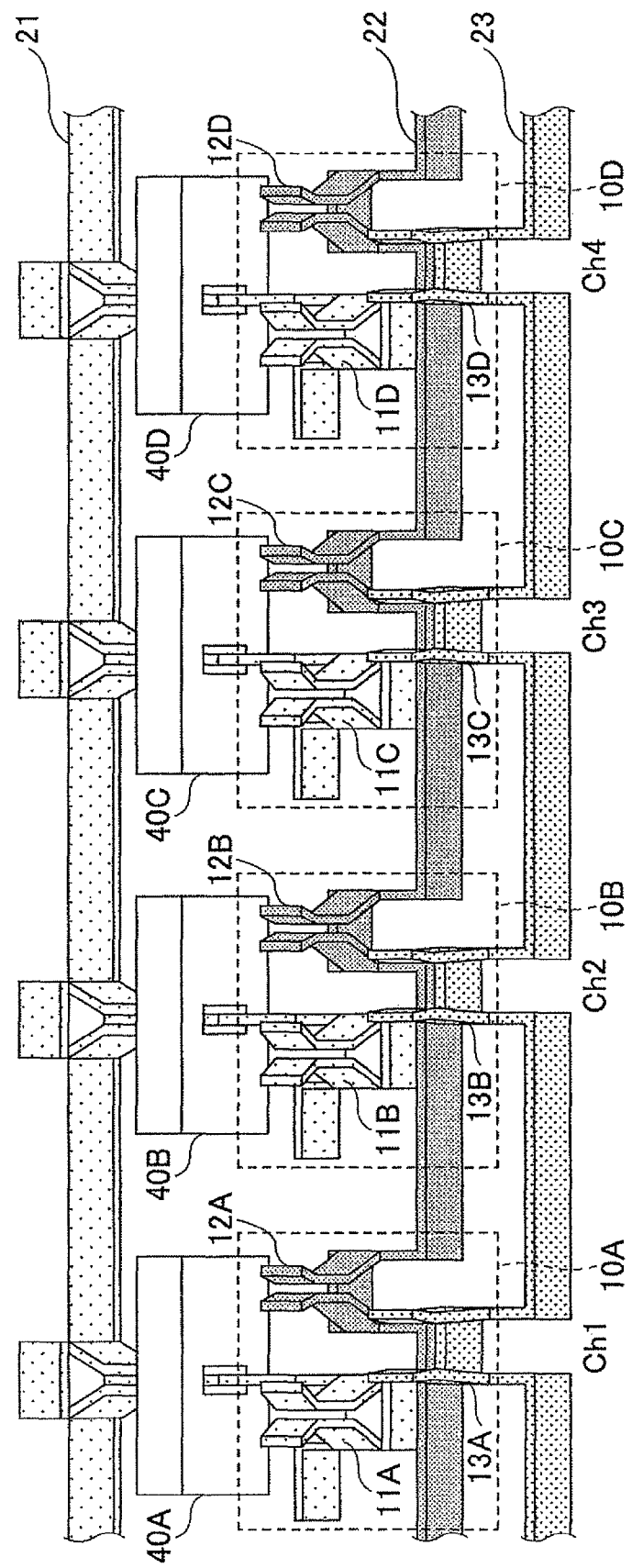
FIG. 1 is a perspective view of a power strip used in first through third embodiments.

Preferred embodiments of the present invention will be described with reference to the accompanying drawings. Those parts and the like that are the same are designated by the same reference numerals, and a description thereof will be omitted.

[First Embodiment]

Figure 2:
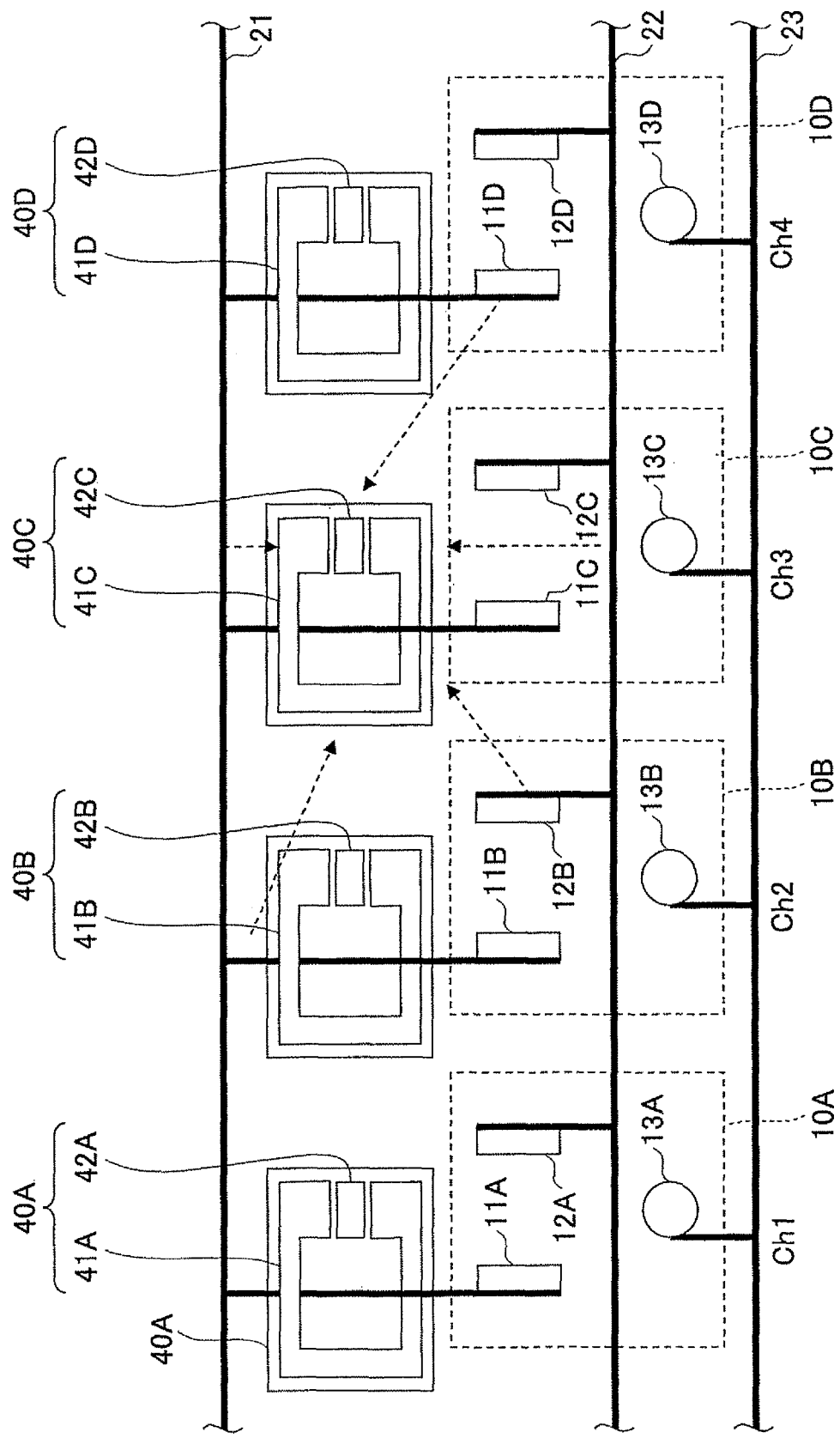
FIG. 2 is a diagram illustrating a structure of the power strip used in the first through third embodiments.

A description will be given of a first embodiment. In this embodiment, a power measuring method is applied to power strips illustrated in FIGS. 1 through 3. A description will be given of the power strip in this embodiment, by referring to FIGS. 1 through 3.

(Power Strip)

The power strip used in this embodiment includes four socket parts 10A, 10B, 10C, and 10D. The socket parts 10A, 10B, 10C, and 10D include power jack terminals 11A, 11B, 11C, and 11D, power jack terminals 12A, 12B, 12C, and 12D, and GND jack terminals (ground terminals) 13A, 13B, 13C, and 13D, respectively. The power jack terminals 11A, 11B, 11C, and 11D are connected to a power bus 21 for supplying power, and the power jack terminals 12A, 12B, 12C, and 12D are connected to a power bys 22 for supplying power. Further, the power bus 21 and the power bus 22 are connected to a socket and the like, not illustrated, for supplying power to the power strip. In addition, the GND jack terminals 13A, 13B, 13C, and 13D are connected to a GND bus 23 that is grounded.

Figure 4:
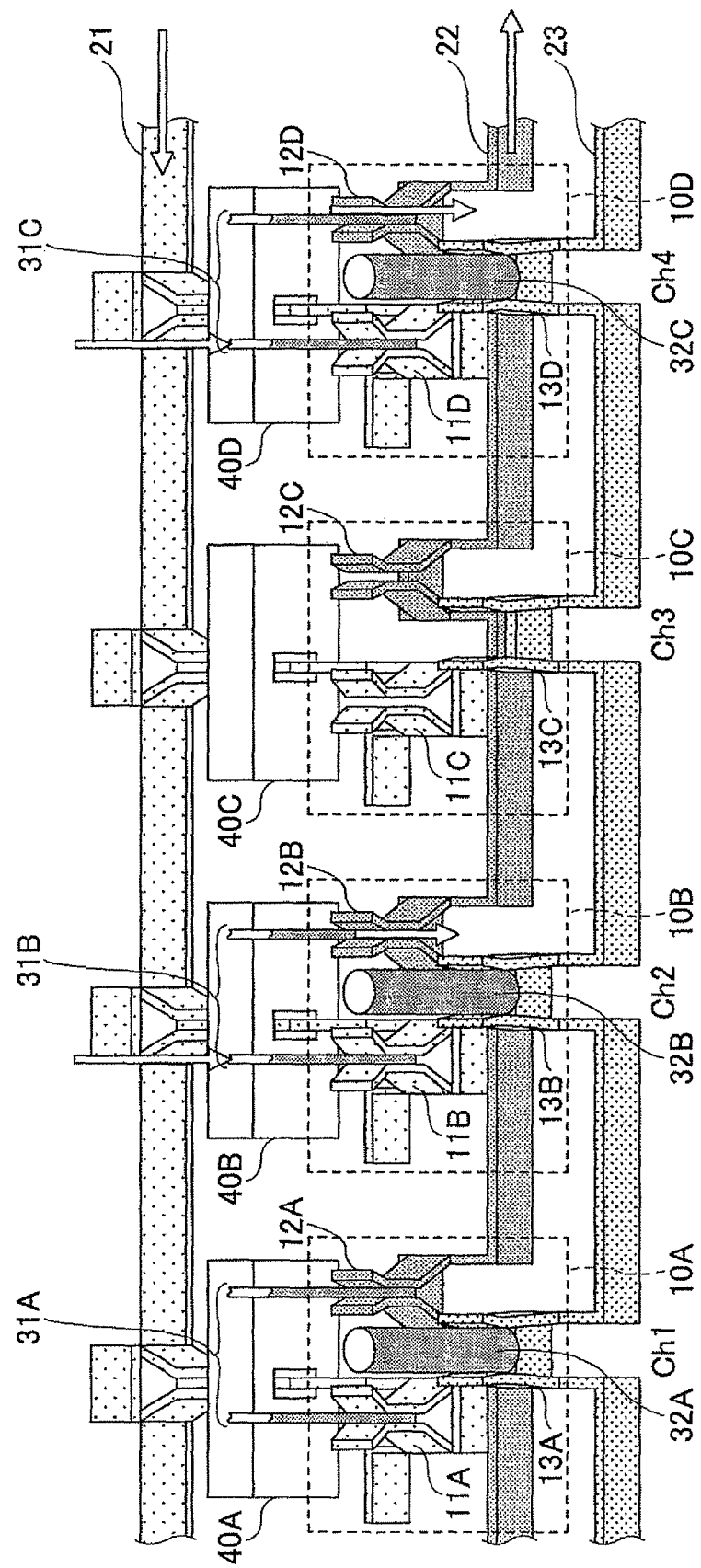
FIG. 4 is a perspective view of a state in which plugs are connected to the power strip.

When supplying power to the electrical apparatus and the like, two blade-shaped power plug terminals provided on the electrical apparatus and the like are plugged into the power jack terminals 11A and 12A, in order to electrically connect the power plug terminals of the electrical apparatus and the like to the power jack terminals 11A and 12A. Hence, a current flows from the power jack terminal 11A to the electrical apparatus and the like, and a current flow from the electrical apparatus and the like to the power jack terminal 12A, to supply the power to the electrical apparatus and the like. The power is similarly supplied to the electrical apparatus and the like when the two power plug terminals provided on the electrical apparatus and the like are plugged into the power jack terminals 11B and 12B, or the power jack terminals 11C and 12C, or the power jack terminals 11D and 12D. FIG. 4 illustrates a state in which power plug terminals 31A, 31B, and 31C of the electrical apparatus and the like are plugged into the three socket parts 10A, 10B, and 10D amongst the four socket parts 10A, 10B, 100, and 10D. In this state, the current flows as indicated by an arrow to each electrical apparatus and the like that is in an ON state, amongst the electrical apparatuses and the like whose power plug terminals 31A, 31B, and 31C are plugged in, and the current further flows to each corresponding socket part and the like. In the state in which the power plug terminals 31A, 31B, and 31C of the electrical apparatus and the like are plugged into the three socket parts 10A, 10B, and 10D, GND plug terminals 32A, 32B, and 32C are plugged into the GND jack terminals 13A, 13B, and 13D.

In the power strip of this embodiment, current sensors 40A, 40B, 40C, and 40D are provided between a power bus 21 and the corresponding power jack terminals 11A, 11B, 11C, and 11D that branch from the power bus 21. The current sensors 40A, 40B, 40C, and 40D detect intensities of magnetic fields generated by currents that flow between the power bus 21 and the corresponding power jack terminals 11A, 11B, 11C, and 11D, in order to detect the current flow. For this reason, the current sensor 40A includes a ferrite core 31A formed with a gap part, and a Hall element 42A, and the Hall element 42A is provided in the gap part of the ferrite core 41A. Similarly, the current sensor 40B includes a ferrite core 41B and a Hall element 42B, the current sensor 40C includes a ferrite core 41C and a Hall element 42B, and the current sensor 40D includes a ferrite core 41D and a Hall element 42D. In addition, the Hall element 42B is provided in a gap part of the ferrite core 41B, the Hall element 42C is provided in a gap part of the ferrite core 41C, and the Hall element 42D is provided in a gap part of the ferrite core 41D.

The current sensor 40A detects the current flow because the magnetic field is generated when the current flows between the power bus 21 and the power jack terminal 11A, a magnetic flux is generated within the ferrite core 41A by the generated magnetic field, and the Hall element 42A detects the generated magnetic flux. The current sensors 40B, 40C, and 40D detect the current flow in a similar manner. In other words, the current sensor 40B detects the current flow because the magnetic field is generated when the current flows between the power bus 21 and the power jack terminal 11B, a magnetic flux is generated within the ferrite core 41B by the generated magnetic field, and the Hall element 42B detects the generated magnetic flux. The current sensor 40C detects the current flow because the magnetic field is generated when the current flows between the power bus 21 and the power jack terminal 11C, a magnetic flux is generated within the ferrite core 41C by the generated magnetic field, and the Hall element 42C detects the generated magnetic flux. In addition, the current sensor 40D detects the current flow because the magnetic field is generated when the current flows between the power bus 21 and the power jack terminal 11D, a magnetic flux is generated within the ferrite core 41D by the generated magnetic field, and the Hall element 42D detects the generated magnetic flux.

Figure 3:
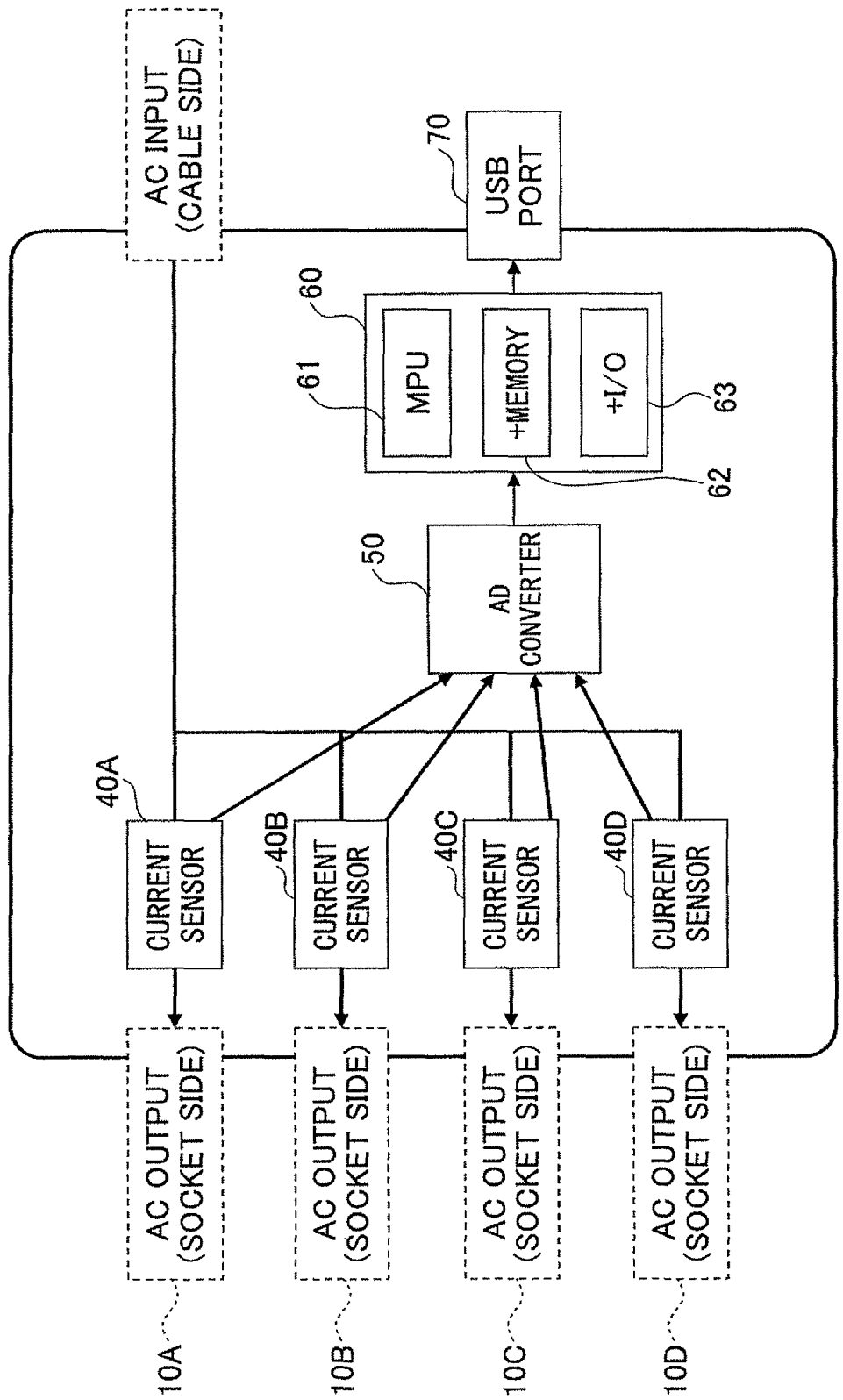
FIG. 3 is a block diagram illustrating the power strip used in the first through third embodiments.

In this embodiment, as illustrated in the example of FIG. 3, the Hall element detects the magnetic field that is generated when the AC current flows. However, when the Hall element is used, the supplied power may be AC power or DC power. Further, when the supplied power is AC power, the ferrite core may be a current transformer type provided with a coil and the like. In this case, it is unnecessary to provide the gap part in the ferrite core.

According to the power strip of this embodiment, the currents flowing in the socket parts 10A, 10B, 10C, and 10D may be calculated based on output voltage values detected by the corresponding current sensors 40A, 40B, 40C, and 40D. Hence, the power consumption of the electrical apparatus and the like connected to each socket part may be calculated based on the corresponding current flow that is calculated.

The power strip of this embodiment includes an AD converter (Analog-to-Digital converter) 50, a control part 60, and a communication part 70.

The AD converter 50 converts the output voltage values detected by the Hall elements 42A, 42B, 42C, and 42D, that are analog signals, into digital signals.

The control part 60 includes a MPU (Micro Processing Unit) 61 to perform computations for calculating the current flow, a memory part 62 to write and read information, and an I/O part 63 to control information transfer via the communication part 70. A memory for temporarily storing information may be provided with respect to the MPU 61 in addition to the memory part 62. The MPU 61 may also be referred to as a computing part, and the memory part 62 may also be referred to as a storage part.

For example, the communication part 70 may be formed by a USB (Universal Serial Bus) port. In a state in which the communication part 70 and an electronic computing apparatus such as a computer, that is not illustrated, are connected, information may be exchanged between the communication part 70 and the computer that is not illustrated under the control of the I/O part 63.

In the power strip of this embodiment, the magnetic field is generated by the current flow, and the current flow is measured by detecting the generated magnetic field. For this reason, when the current flows in an adjacent socket, the magnetic field is generated by the current flow of the adjacent socket, and the magnetic flux may be generated in the ferrite core of the socket in which no current flow exists, due to the effects of the magnetic flux generated in the adjacent socket. When a change occurs in the output voltage value detected by the Hall element of the socket that does not supply the power to the electrical apparatus and the like but is affected by the magnetic flux generated in the adjacent socket, the current flow may be detected as if the current actually flows. In addition, in a case in which the current flows in a first socket part and the current also flows in a second socket adjacent thereto, the magnetic field generated by the current flow in the second socket may affect the magnetic flux generated by the ferrite core of the first socket. In this case, the output voltage value detected by the Hall element of the first socket may change, and a current flow different from the actual current flow may be detected.

A more detailed description will be given with reference to FIG. 4. When the electrical apparatuses and the like are connected to the socket parts 10B, 10D and the currents flow, magnetic fields are generated by the current flowing in the socket parts 10B and 10D. These generated magnetic fields may affect and change the magnetic flux generated by the ferrite core 41C for detecting the current flow in the adjacent socket part 10C.

Because the Hall element 42C detects the output voltage value based on the magnetic flux that changes within the ferrite core 41C, the current flow detected based on this output voltage value may be different from the actual current flow in the socket 10C. For this reason, in the socket part 10C, the current flow may be detected as if the current flow existed, even through there actually is no current flow.

(Current Measuring Method and Power Measuring Method)

Next, a description will be given of a current measuring method and a power measuring method in this embodiment, by referring to FIGS. 5 through 8. First, a description will be given of a process up to forwarding of the power strip in this embodiment, by referring to FIG. 5.

First, in a step S102, the power strip of this embodiment described above is assembled. This power strip includes four socket parts, and the socket parts 10A, 10B, 10C, and 10D may be labeled as 1ch, 2ch, 3ch, and 4ch, respectively.

Next, in a step S104, the assembled power strip is connected to a measuring apparatus. More particularly, a power supply and the measuring apparatus for measuring the current flow and the like are connected to the assembled power strip.

Next, in a step S106, the output voltage value of each Hall element is measured for each of the socket parts in a state in which no current flows in each of the socket parts. In other words, in a case in which the current flow is 0 A in each of the socket parts 10A, 10B, 10C, and 10D, the output voltage value of each of the Hall elements 42A, 42B, 42C, and 42D is measured. In this state, the output voltage values detected by the Hall elements 42A, 42B, 42C, and 42D are V10, V20, V30, and V40, respectively, and each of the output voltage values is temporarily stored. The state in which no current flows in the socket part refers to a state in which no current is supplied to the socket part, and excludes a state in which even a slight current flows.

Next, in a step S108, the output voltage values in a state in which the current flows in the socket part 1ch are measured. That is, the output voltage values of the Hall elements 42A, 42B, 42C, and 42D are measured in a state in which a current IA, such as a current of 1 A, for example, is supplied only to the socket part 10A and no current is supplied to the other socket parts 10B, 10C, and 10D. In this state, the output voltage values detected by the Hall elements 42A, 42B, 42C, and 42D are V11, V21, V31, and V41, respectively, and each of the output voltage values is temporarily stored.

Next, in a step S110, the output voltage values in a state in which the current flows in the socket part 2ch are measured. That is, the output voltage values of the Hall elements 42A, 42B, 42C, and 42D are measured in a state in which the current IA, such as the current of 1 A, for example, is supplied only to the socket part 10B and no current is supplied to the other socket parts 10A, 10C, and 10D. In this state, the output voltage values detected by the Hall elements 42A, 42B, 42C, and 42D are V12, V22, V32, and V42, respectively, and each of the output voltage values is temporarily stored.

Next, in a step S112, the output voltage values in a state in which the current flows in the socket part 3ch are measured. That is, the output voltage values of the Hall elements 42A, 42B, 42C, and 42D are measured in a state in which the current IA, such as the current of 1 A, for example, is supplied only to the socket part 10C and no current is supplied to the other socket parts 10A, 10B, and 10D. In this state, the output voltage values detected by the Hall elements 42A, 42B, 42C, and 42D are V13, V23, V33, and V43, respectively, and each of the output voltage values is temporarily stored.

Next, in a step S114, the output voltage values in a state in which the current flows in the socket part 4ch are measured. That is, the output voltage values of the Hall elements 42A, 42B, 42C, and 42D are measured in a state in which the current IA, such as the current of 1 A, for example, is supplied only to the socket part 10D and no current is supplied to the other socket parts 10A, 10B, and 10C. In this state, the output voltage values detected by the Hall elements 42A, 42B, 42C, and 42D are V14, V24, V34, and V44, respectively, and each of the output voltage values is temporarily stored.

Figure 6:
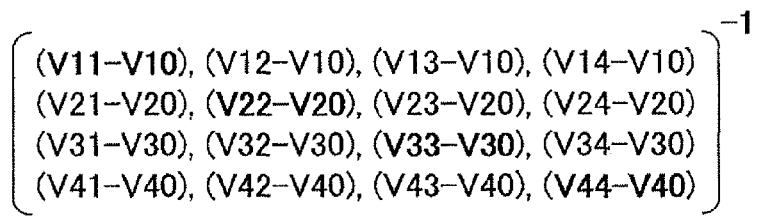
FIG. 6 is a diagram for explaining the current measuring method in the first embodiment.

Next, in a step S116, a correction formula is calculated. More particularly, based on the output voltage values measured in each of the steps S106 through S114, a matrix illustrated in FIG. 6 is calculated as the correction formula. This matrix calculated as the correction formula is an inverse matrix of a matrix having as its elements differences between the output voltage values measured in the steps S108 through 5114 and the output voltage values measured in the step S106. The matrix forming the correction formula may be calculated in the MPU 61, or may be calculated in a computer that is not illustrated and is connected via the communication part 70. When calculating the correction formula in the computer that is not illustrated, required information may be exchanged between the communication part 70 and the computer.

Next, correction data are written in a step S118. More particularly, the output voltage values V10, V20, V30, and V40 that are measured in the step S106 and are to be initial values, and the matrix calculated in the step S116 as the correction formula are written in the memory part 62 of the power strip.

Figure 5:
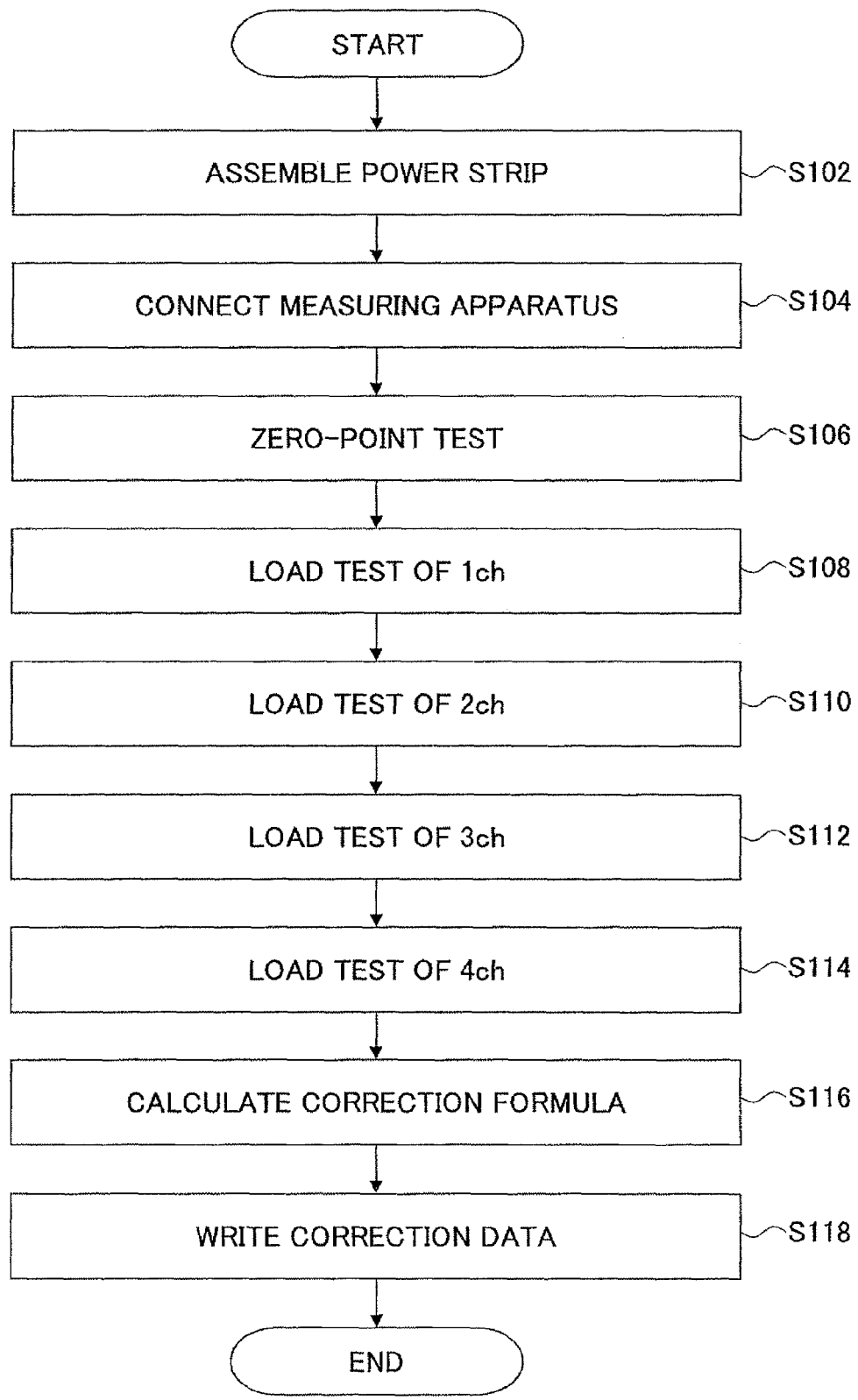
FIG. 5 is a flow chart for explaining a current measuring method in the first embodiment.

The power strip of this embodiment is forwarded in the state described above, and thus, the process of the flow chart illustrated in FIG. 5 ends.

Figure 7:
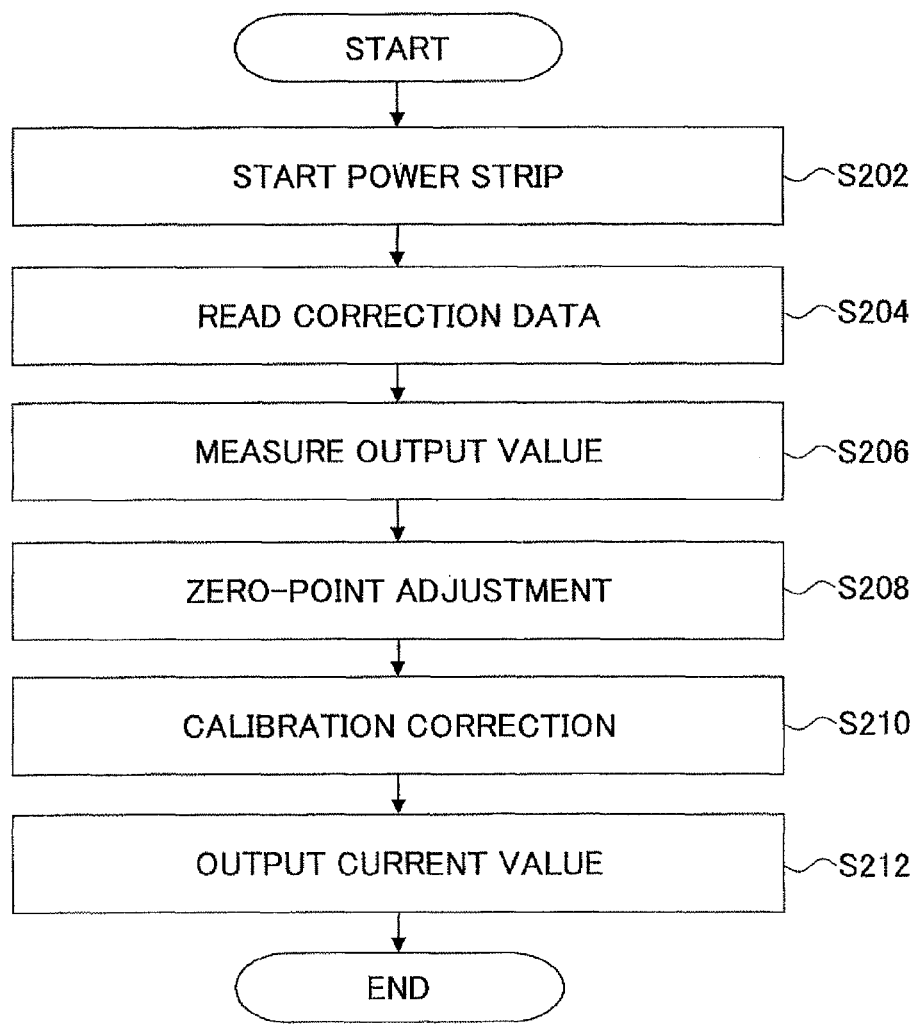
FIG. 7 is a flow chart for explaining the current measuring method in the first embodiment.

Next, a description will be given of the current measuring method and the power measuring method in this embodiment, by referring to FIG. 7. The power strip used in the current measuring method and the power measuring method in this embodiment is the power strip forwarded after ending the process of the flow chart illustrated in FIG. 5.

First, in a step S202, the power strip used in this embodiment is started. More particularly, the power strip used in this embodiment is connected to the power supply. For example, when the power strip used in this embodiment is provided with a plug for receiving power via a cable and the like, this plug is connected to a socket that forms the power supply.

Next, in a step S204, the correction data are read from the memory part 62. More particularly, the information written in the step S118, that is, the output voltage values V10, V20, V30, and V40 that are to be the initial values, and the matrix forming the correction formula that are stored in the memory part 62 are read by the MPU 61.

Next, in a step S206, the output voltage values of the Hall elements 42A, 42B, 42C, and 42D are measured. In this state, the currents flowing in the socket parts 10A, 10B, 10C, and 10D are separately measured as the output voltage values of the corresponding Hall elements 42A, 42B, 42C, and 42D, respectively. The output voltage values of the Hall elements 42A, 42B, 42C, and 42D correspond to the currents flowing in the socket parts 10A, 10B, 10C, and 10D, respectively. The output voltage values detected by the Hall elements 42A, 42B, 42C, and 42D in this state are stored as V1, V2, V3, and V4, respectively. This measurement may be made based on a predetermined command issued from the computer that is not illustrated. In this case, the predetermined command may be sent to the MPU 61 via the communication part 70, and the output voltage values of the Hall elements 42A, 42B, 42C, and 42D may be measured under the control of the MPU 61.

Next, in a step S208, a zero-point adjustment is performed. More particularly, differences are obtained between the output voltage values measured in the step S206 and the initial values V10, V20, V30, and V40, respectively. In other words, the zero-point adjustment corresponding to each of the socket parts 10A, 10B, 10C, and 10D is performed by calculating the differences V1-V10, V2-V20, V3-V30, and V4-V40 in the MPU 61.

Next, in a step S210, a calibration correction is performed. More particularly, current values flowing in the socket parts 10A, 10B, 10C, and 10D are calculated in the MPU 61 based on the determinant illustrated in FIG. 8. The determinant illustrated in FIG. 8 may be calculated based on a matrix (matrix that becomes an inverse matrix) P2 that becomes the correction formula, and a matrix P1 having as its elements a product of the zero-point adjustment result calculated in the step S208 and IA. The current values I1, I2, I3, and I4 calculated in this manner are the current values actually flowing in the socket parts 10A, 10B, 10C, and 10D, respectively, and are accurate current values in that the effects from the adjacent socket parts are eliminated. IA is the amount of current flow during the measurement from the step S108 to the step S114. For example, the amount of current flow, IA, from the step S108 to the step S114 is 1 A.

Next, in a step S212, the current values I1, I2, I3, and I4 calculated in the step S210 are output. More particularly, the current values I1, I2, I3, and I4 are output from the power strip to the computer or the like that is not illustrated, via the communication part 70. The computer may calculate the power consumption at the socket parts 10A, 10B, 10C, and 10D based on the current values I1, I2, I3, and I4 and the voltage applied to the power strip. Hence, it is possible to accurately know the power consumption of each of the electrical apparatuses and the like connected to the socket parts 10A, 10B, 10C, and 10D.

The current measuring method and the power measuring method in this embodiment ends after the process described above. According to the current measuring method and the power measuring method in this embodiment, it is possible to accurately know the power consumption of each of the electrical apparatuses and the like connected to the socket parts 10A, 10B, 10C, and 10D.

There are four socket parts in this embodiment, however, the number of socket parts may be greater than or less than four. It is possible to accurately know the power consumption at each of the socket parts in a similar manner when the number of socket parts is greater than or less than four.

[Second Embodiment]

Figure 9:
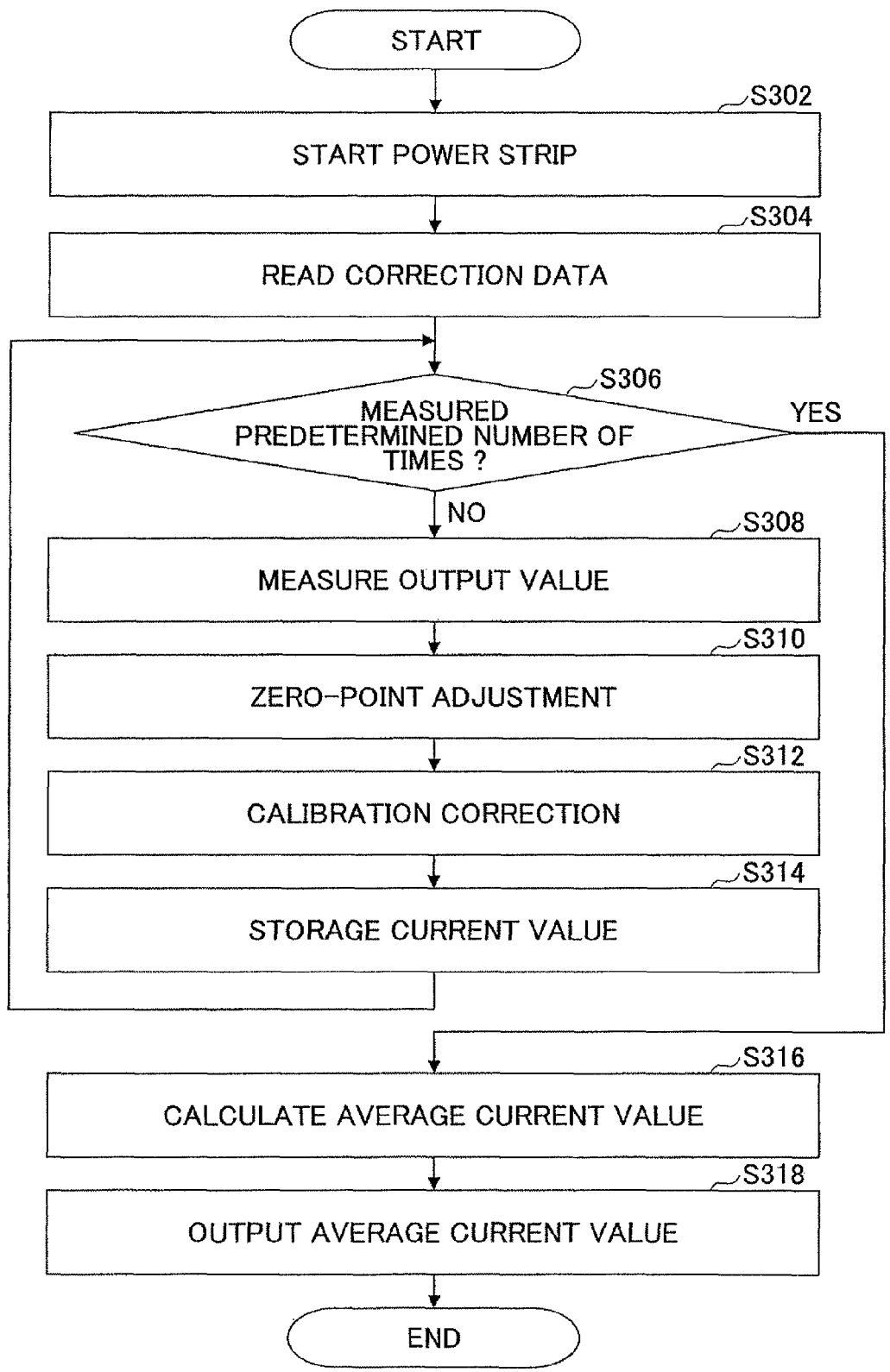
FIG. 9 is a flow chart for explaining the current measuring method in the second embodiment.

Next, a description will be given of a second embodiment. The current measuring method and the power measuring method in this embodiment uses the power strip in the state in which the process of the flow chart illustrated in FIG. 5 is ended in the first embodiment, and measures the current a plurality of times. A description will be given of this embodiment, by referring to FIG. 9.

First, in a step S302, the power strip used in this embodiment is started. More particularly, the power strip used in this embodiment is connected to a power supply. For example, when the power strip used in this embodiment is provided with a plug for receiving power via a cable and the like, this plug is connected to a socket that forms the power supply.

Next, in a step S304, the correction data are read from the memory part 62. More particularly, the information written in the step S118 of the first embodiment, that is, the output voltage values V10, V20, V30, and V40 that are to be the initial values, and the matrix forming the correction formula that are stored in the memory part 62 are read by the MPU 61.

Next, in a step S306, a judgement is made to determine whether the measurement is performed a predetermined number of times. More particularly, in the current measuring method and the power measuring method in this embodiment, the judgement is made to determine whether the measurement is performed the predetermined number of times, because the measurement by the Hall elements is performed the predetermined times and thereafter averaged. For example, a counter that has an initial value 0 and is incremented by one every time the measurement by the Hall element is performed may be used to determine whether the measurement by the Hall elements is performed the predetermined number of times, that is, N times. The process advances to a step S316 when it is judged that the measurement by the Hall elements is performed the predetermined number of times. On the other hand, the process advances to a step S308 when it is judged that the number of times the measurement by the Hall elements is performed has not reached the predetermined number of times.

Next, in the step S308, the output voltage values of the Hall elements 42A, 42B, 42C, and 42D are measured. In this state, the currents flowing in the socket parts 10A, 10B, 10C, and 10D are measured separately in the corresponding Hall elements as the output voltage values. The measured output voltages correspond to the currents flowing in the socket parts 10A, 10B, 10C, and 10D, respectively. The output voltage values of the Hall elements 42A, 42B, 42C, and 42D measured in this state are stored as V1, V2, V3, and V4, respectively.

Next, in a step S310, a zero-point adjustment is performed. More particularly, differences are obtained between the output voltage values measured in the step S308 and the initial values V10, V20, V30, and V40, respectively. In other words, the zero-point adjustment corresponding to each of the socket parts 10A, 10B, 10C, and 10D is performed by calculating the differences V1-V10, V2-V20, V3-V30, and V4-V40 in the MPU 61.

Next, in a step S312, a calibration correction is performed. More particularly, current values flowing in the socket parts 10A, 10B, 10C, and 10D are calculated in the MPU 61 based on the determinant illustrated in FIG. 8. The determinant illustrated in FIG. 8 is calculated based on the matrix (matrix that becomes an inverse matrix) P2 that becomes the correction formula, and the matrix P1 having as its elements a product of the zero-point adjustment result calculated in the step S310 and IA. The current values I11, I21, I31, and I41 calculated in this manner are the current values actually flowing in the socket parts 10A, 10B, 10C, and 10D, respectively, and are accurate current values in that the effects from the adjacent socket parts are eliminated. In this embodiment, the current values I1, I2, I3, and I4 in FIG. 8 are substituted by the current values I11, I21, I31, and I41, respectively.

Next, in a step S314, the current values I11, I21, I31, and I41 calculated in the step S312 are stored. More particularly, the current values I11, I21, I31, and I41 are stored in the memory part 62 or a memory within the MPU 61. The process returns to the step S306 after the step S314. The current values that are calculated thereafter when the output voltage values are calculated the second time are stored as current values I12, I22, I32, and I42, and the current values that are calculated thereafter when the output voltage values are calculated the nth time are stored as current values I1n, I2n, I3n, and I4n.

On the other hand, in the step S316, an average current value is calculated. More particularly, average current values I10, I20, I30, and I40 are calculated by averaging the current values, obtained for each of the measurements, stored in the memory part 62 or the memory within the MPU 61. In other words, the average current value I10 is calculated by calculating an average value of the current values I11, I12, . . . , I1n, . . . . Similarly, the average current value I20 is calculated by calculating an average value of the current values I21, I22, . . . , I2n, . . . , the average current value I30 is calculated by calculating an average value of the current values I31, I32, . . . , I3n, . . . , and the average current value I40 is calculated by calculating an average value of the current values I41, I42, . . . , I4n, . . . .

Next, in a step S318, the average current values I10, S20, I30, and I40 are output from the power strip to the computer or the like that is not illustrated, via the communication part 70. The computer may calculate the power consumption of the electrical apparatuses and the like connected to the socket parts 10A, 10B, 10C, and 10D based on the average current values I10, I20, I30, and I40 and the voltage applied to the power strip.

The current measuring method and the power measuring method in this embodiment ends after the process described above. According to the current measuring method and the power measuring method in this embodiment, it is possible to accurately know the power consumption of each of the electrical apparatuses and the like connected to the socket parts 10A, 10B, 10C, and 10D.

Features other than those described above for the second embodiment are the same as those of the first embodiment described above.

[Third Embodiment]

Next, a description will be given of a third embodiment. The current measuring method and the power measuring method in this embodiment are different from those of the first embodiment. The power strip used in this embodiment may be the same as that used in the first embodiment. First, a description will be given of the process up to the forwarding of the power strip used in this embodiment, by referring to FIG. 10.

First, in a step S402, the power strip used in the embodiment described above is assembled. The power strip includes four socket parts, and the socket parts 10A, 10B, 10C, and 10D may be labeled as 1ch, 2ch, 3ch, and 4ch, respectively.

Next, in a step S404, the assembled power strip is connected to a measuring apparatus. More particularly, a power supply and the measuring apparatus for measuring the current flow and the like are connected to the assembled power strip.

Next, in a step S406, the output voltage value of each Hall element is measured for each of the socket parts in a state in which no current flows in each of the socket parts. In other words, in a case in which the current flow is 0 A in each of the socket parts 10A, 10B, 10C, and 10D, the output voltage value of each of the Hall elements 42A, 42B, 42C, and 42D is measured. In this state, the output voltage values detected by the Hall elements 42A, 42B, 42C, and 42D are V10, V20, V30, and V40, respectively, that become initial values. The output voltage values V10, V20, V30, and V40 are temporarily stored.

Next, in a step S408, the output voltage values in a state in which the current flows in the socket part 1ch are measured. That is, the output voltage values of the Hall elements 42A, 42B, 42C, and 42D are measured in a state in which a current IA, such as a current of 1 A, for example, is supplied only to the socket part 10A and no current is supplied to the other socket parts 10B, 100, and 10D. In this state, the output voltage values detected by the Hall elements 42A, 42B, 42C, and 42D are V11, V21, V31, and V41, respectively, and each of the output voltage values is temporarily stored.

Next, in a step S410, the output voltage values in a state in which the current flows in the socket part 2ch are measured. That is, the output voltage values of the Hall elements 42A, 42B, 42C, and 42D are measured in a state in which the current IA, such as the current of 1 A, for example, is supplied only to the socket part 10B and no current is supplied to the other socket parts 10A, 100, and 10D. In this state, the output voltage values detected by the Hall elements 42A, 42B, 42C, and 42D are V12, V22, V32, and V42, respectively, and each of the output voltage values is temporarily stored.

Next, in a step S412, the output voltage values in a state in which the current flows in the socket part 3ch are measured. That is, the output voltage values of the Hall elements 42A, 42B, 42C, and 42D are measured in a state in which the current IA, such as the current of 1 A, for example, is supplied only to the socket part 100 and no current is supplied to the other socket parts 10A, 10B, and 10D. In this state, the output voltage values detected by the Hall elements 42A, 42B, 42C, and 42D are V13, V23, V33, and V43, respectively, and each of the output voltage values is temporarily stored.

Next, in a step S414, the output voltage values in a state in which the current flows in the socket part 4ch are measured. That is, the output voltage values of the Hall elements 42A, 42B, 42C, and 42D are measured in a state in which the current IA, such as the current of 1 A, for example, is supplied only to the socket part 10D and no current is supplied to the other socket parts 10A, 10B, and 100. In this state, the output voltage values detected by the Hall elements 42A, 42B, 42C, and 42D are V14, V24, V34, and V44, respectively, and each of the output voltage values is temporarily stored.

Next, correction data are written in a step S416. More particularly, the output voltage values V10, V20, V30, and V40 that are measured in the step S406 and the output voltage values of the Hall elements 42A, 42B, 42C, and 42D that are measured in the steps S408 through S414 are written in the memory part 62.

Figure 10:
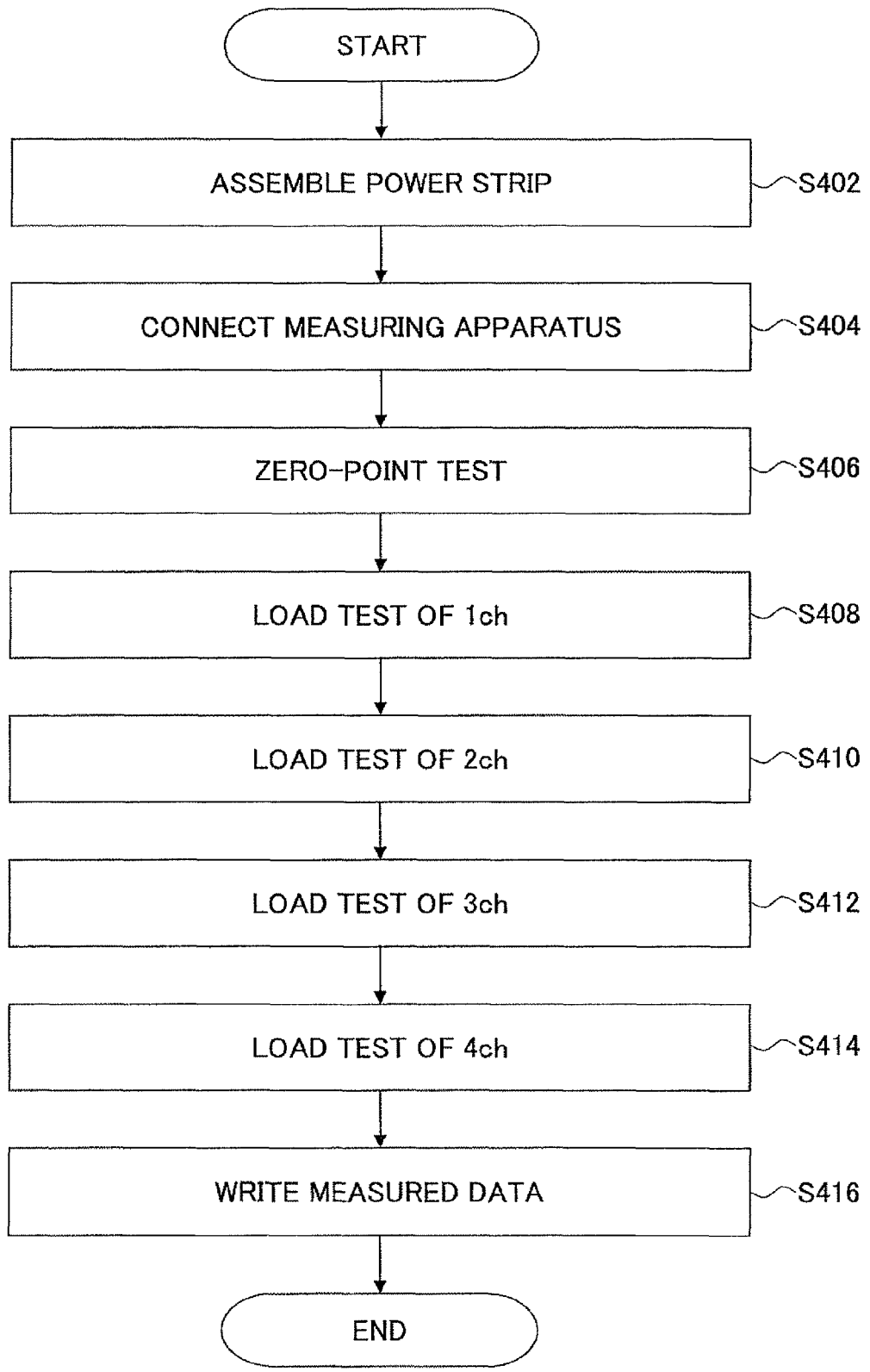
FIG. 10 is a flow chart for explaining the current measuring method in the third embodiment.

The power strip of this embodiment is forwarded in the state described above, and thus, the process of the flow chart illustrated in FIG. 10 ends.

Figure 11:
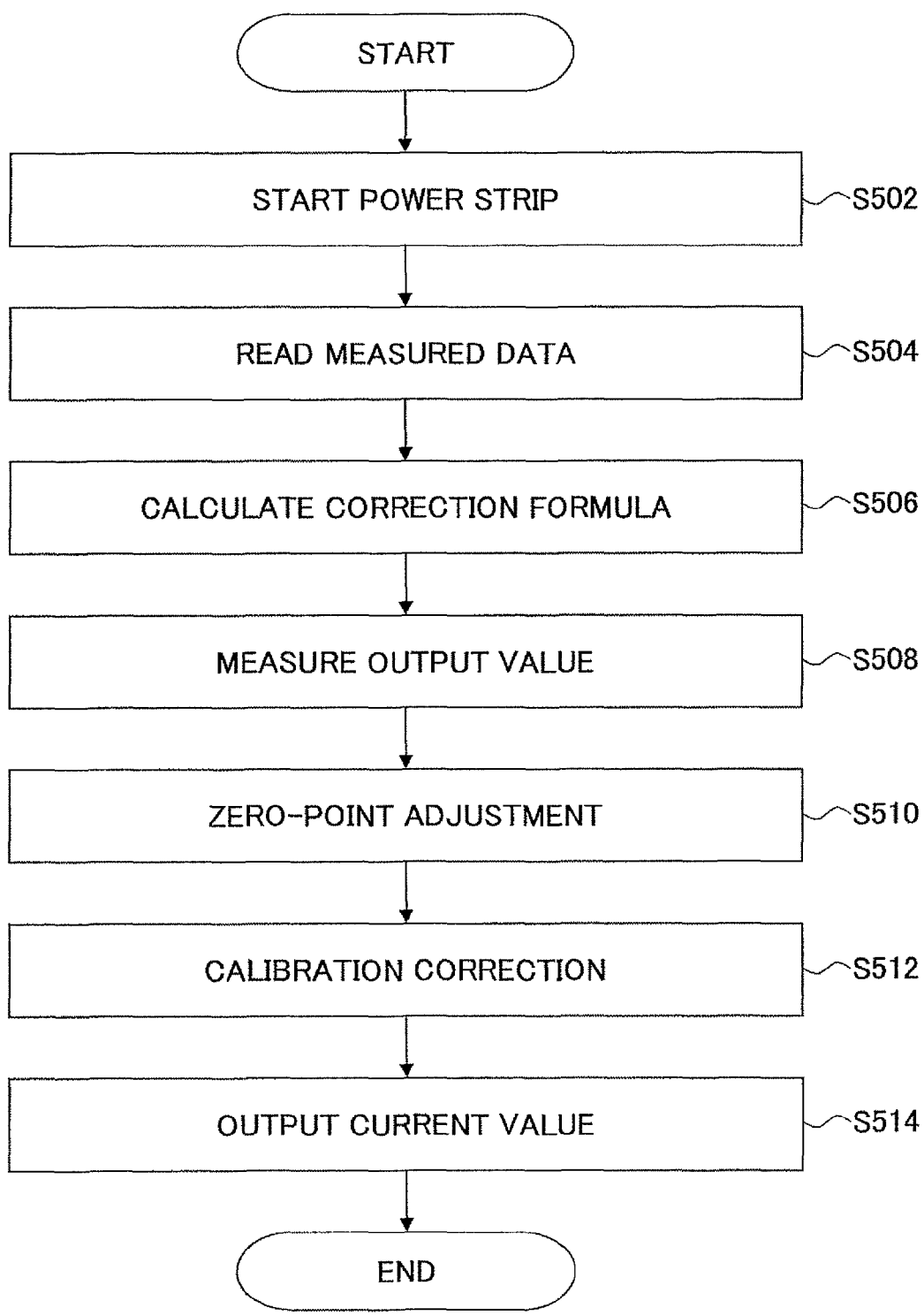
FIG. 11 is a flow chart for explaining the current measuring method in the third embodiment.

Next, a description will be given of the current measuring method and the power measuring method in this embodiment, by referring to FIG. 11. The power strip used in the current measuring method and the power measuring method in this embodiment is the power strip forwarded after ending the process of the flow chart illustrated in FIG. 10.

First, in a step S502, the power strip used in this embodiment is started. More particularly, the power strip used in this embodiment is connected to the power supply. For example, when the power strip used in this embodiment is provided with a plug for receiving power via a cable and the like, this plug is connected to a socket that forms the power supply.

Next, in a step S504, the correction data are read from the memory part 62. More particularly, the information written in the step S416, that is, the output voltage values measured by the steps S406 through S414 described above are read by the MPU 61.

Next, in a step S506, the correction formula is calculated. More particularly, the matrix illustrated in FIG. 6 that forms the correction formula is calculated based on the output voltage values read in the step S504. The correction formula is an inverse matrix of a matrix having as its elements differences between the output voltage values measured in the steps S408 through S414 and the output voltage values measured in the step S504.

Next, in a step S508, the output voltage values of the Hall elements 42A, 42B, 42C, and 42D are measured. In this state, the currents flowing in the socket parts 10A, 10B, 10C, and 10D are separately measured as the output voltage values of the corresponding Hall elements 42A, 42B, 42C, and 42D, respectively. The output voltage values of the Hall elements 42A, 42B, 42C, and 42D correspond to the currents flowing in the socket parts 10A, 10B, 100, and 10D, respectively. The output voltage values detected by the Hall elements 42A, 42B, 42C, and 42D in this state are stored as V1, V2, V3, and V4, respectively. This measurement may be made based on a predetermined command issued from the computer that is not illustrated. In this case, the predetermined command may be sent to the MPU 61 via the communication part 70, and the output voltage values of the Hall elements 42A, 42B, 42C, and 42D may be measured under the control of the MPU 61.

Next, in a step S510, a zero-point adjustment is performed. More particularly, differences are obtained between the output voltage values measured in the step S406 and the initial values V10, V20, V30, and V40, respectively. In other words, the zero-point adjustment corresponding to each of the socket parts 10A, 10B, 10C, and 10D is performed by calculating the differences V1-V10, V2-V20, V3-V30, and V4-V40 in the MPU 61.

Next, in a step S512, a calibration correction is performed. More particularly, current values flowing in the socket parts 10A, 10B, 10C, and 10D are calculated in the MPU 61 based on the determinant illustrated in FIG. 8. The determinant illustrated in FIG. 8 may be calculated based on a matrix (matrix that becomes an inverse matrix) P2 that becomes the correction formula, and a matrix P1 having as its elements a product of the zero-point adjustment result calculated in the step S510 and IA. The current values I1, I2, I3, and I4 calculated in this manner are the current values actually flowing in the socket parts 10A, 10B, 10C, and 10D, respectively, and are accurate current values in that the effects from the adjacent socket parts are eliminated.

Next, in a step S514, the current values I1, I2, I3, and I4 calculated in the step S512 are output. More particularly, the current values I1, I2, I3, and I4 are output from the power strip to the computer or the like that is not illustrated, via the communication part 70. The computer may calculate the power consumption at the socket parts 10A, 10B, 10C, and 10D based on the current values I1, I2, I3, and I4 and the voltage applied to the power strip.

The current measuring method and the power measuring method in this embodiment ends after the process described above. According to the current measuring method and the power measuring method in this embodiment, it is possible to accurately know the power consumption of each of the electrical apparatuses and the like connected to the socket parts 10A, 10B, 10C, and 10D.

There are four socket parts in this embodiment, however, the number of socket parts may be greater than or less than four. It is possible to accurately know the power consumption at each of the socket parts in a similar manner when the number of socket parts is greater than or less than four.

[Fourth Embodiment]

Figure 12:
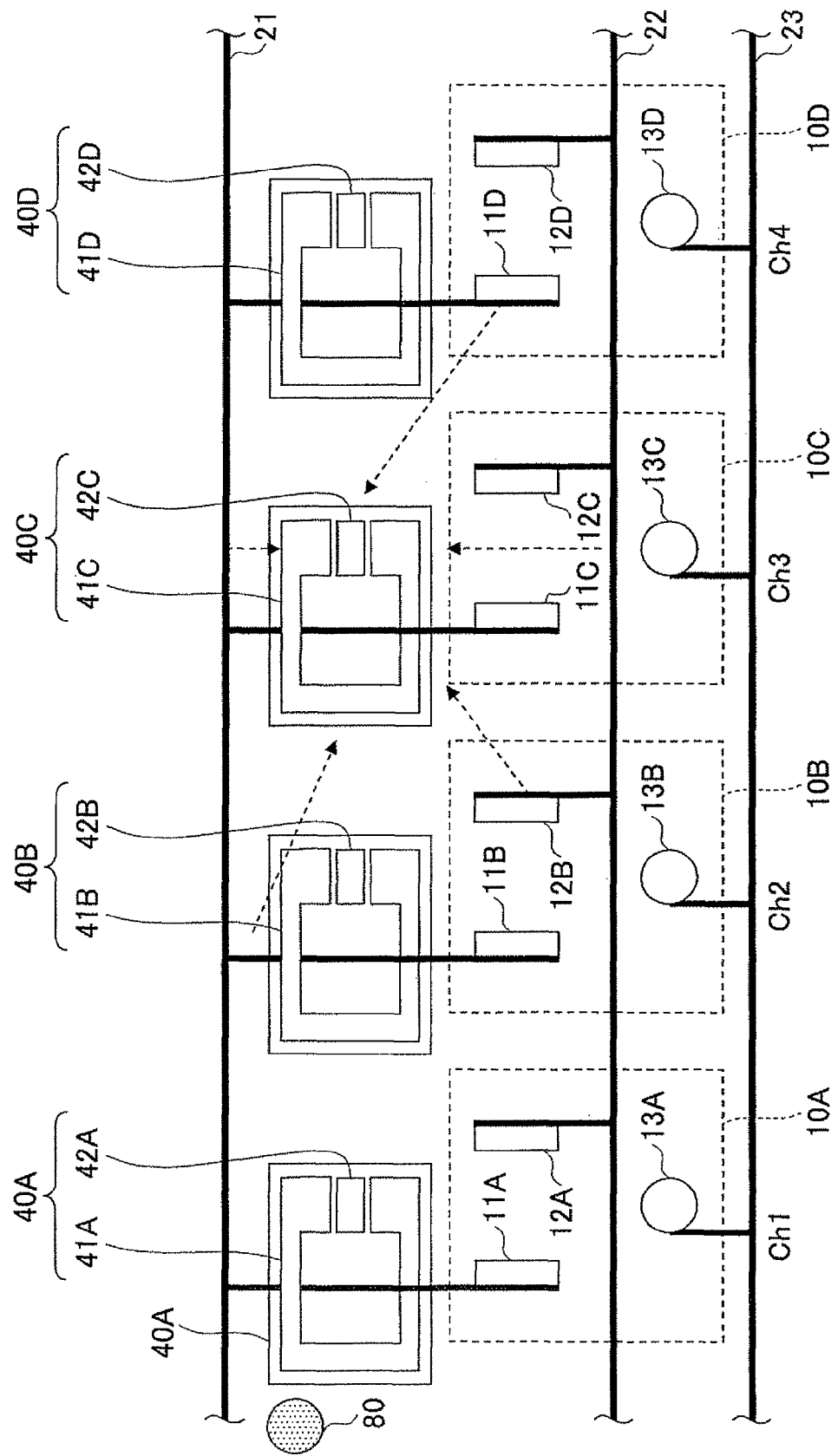
FIG. 12 is a diagram illustrating a structure of the power strip in a fourth embodiment.

Next, a description will be given of a fourth embodiment. The current measuring method and the power measuring method in this embodiment uses a power strip having a structure illustrated in FIG. 12 in which a temperature measuring part 61, such as a thermister, that is provided in a vicinity of the ferrite core.

A temperature measuring part 80 is provided in order to cope with a change in the magnetic flux of the ferrite core in response to a change in temperature. In other words, because the state of the magnetic flux in the ferrite core changes depending on the temperature, the temperature measuring part 80 is provided in order to perform a correction based on the temperature dependency. For this reason, the temperature measuring part 80 may be provided at one location in the vicinity of one of the ferrite cores 41A, 41B, 41C, and 41D, or may be provided in the vicinity of each of the ferrite cores 41A, 41B, 41C, and 41D.

For example, the steps S102 through S118 of the first embodiment illustrated in FIG. 5 are performed for every predetermined temperature of the power strip used in this embodiment. Hence, the correction data for every predetermined temperature may be stored in the memory part 62. For example, the temperature of the power strip is set to 20° C., 30° C., and 40° C., and the correction data at each of these temperatures are calculated according to the method of the first embodiment and stored in the memory part 62.

A description will be given of the above described process, by referring to FIG. 13.

First, in a step S602, the power strip of this embodiment described above is assembled. This power strip includes four socket parts 10A, 10B, 10C, and 10D.

Next, in a step S604, the assembled power strip is connected to a measuring apparatus. More particularly, a power supply and the measuring apparatus for measuring the current flow and the like are connected to the assembled power strip.

Next, in a step S606, a test is performed at a first temperature. More particularly, the steps S106 through 5114 of the first embodiment are performed at the first temperature. For example, the steps S106 through S114 may be performed in a state in which the temperature of the power strip is set to 20° C.

Next, in a step S608, a test is performed at a second temperature. More particularly, the steps S106 through S114 of the first embodiment are performed at the second temperature. For example, the steps S106 through S114 may be performed in a state in which the temperature of the power strip is set to 30° C.

Next, in a step S610, a test is performed at a third temperature. More particularly, the steps S106 through S114 of the first embodiment are performed at the third temperature. For example, the steps S106 through S114 may be performed in a state in which the temperature of the power strip is set to 40° C.

Next, in a step S612, the correction formula is calculated. More particularly, the correction formula is calculated for each of the first temperature, the second temperature, and the third temperature, based on the output voltage values measured in the steps S606, S608, and 5610.

Next, the correction data are written in a step S614. More particularly, the correction formulas and the initial values for each of the first temperature, the second temperature, and the third temperature are written in the memory part 62 of the power strip.

Figure 13:
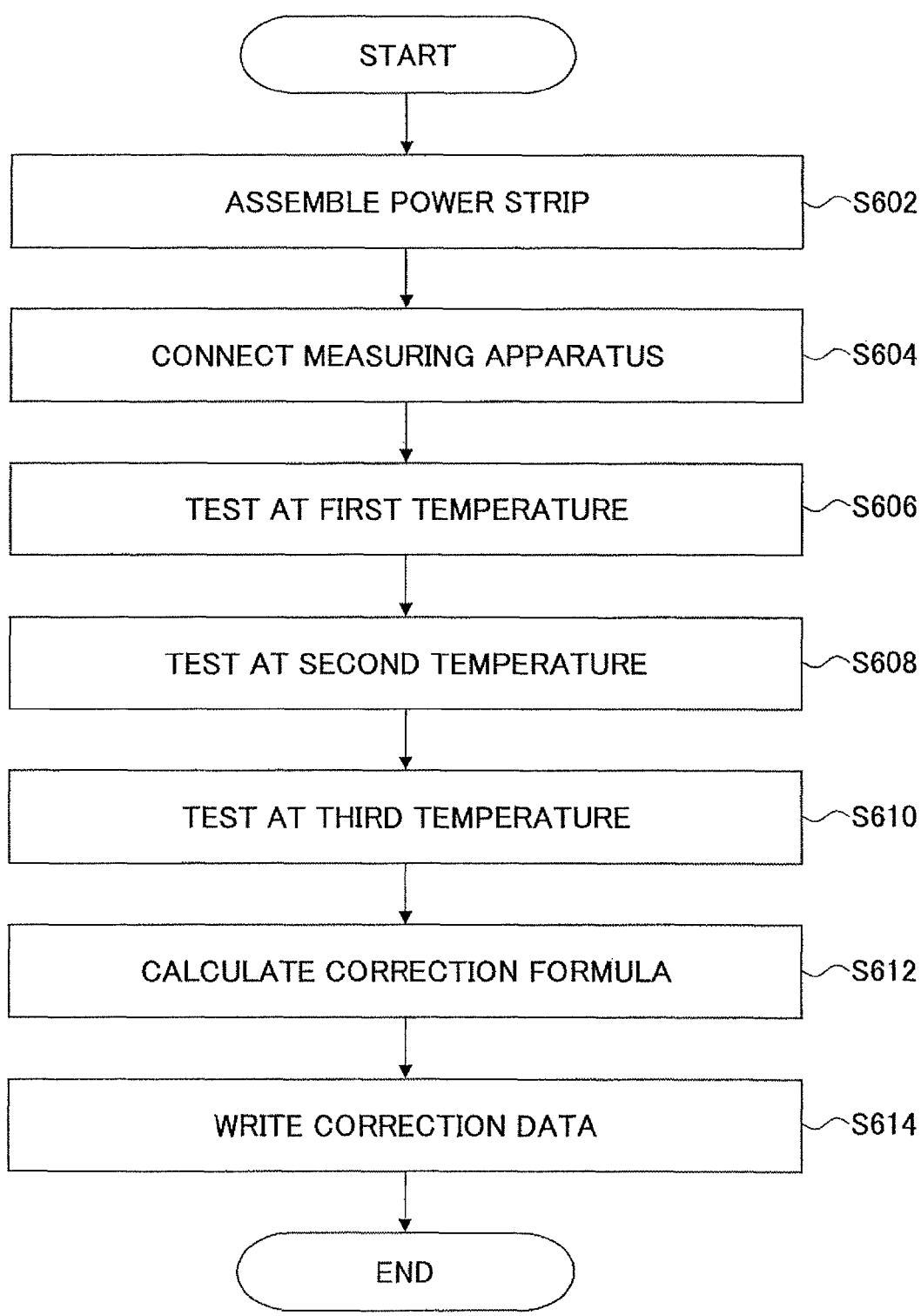
FIG. 13 is a flow chart for explaining the current measuring method in the fourth embodiment.

The power strip of this embodiment is forwarded in the state described above, and thus, the process of the flow chart illustrated in FIG. 13 ends.

In addition, when measuring the power in the power strip, the correction data used for the power measurement are selectively read from the memory part 62 that stores the correction data, based on the temperature measured by the temperature measuring part 80. Thereafter, the current flowing in each of the socket parts 10A, 10B, 10C, and 10D of the power strip is calculated based on the selectively read correction data, in order to measure the power consumption at each of the socket parts 10A, 10B, 10C, and 10D.

Figure 14:
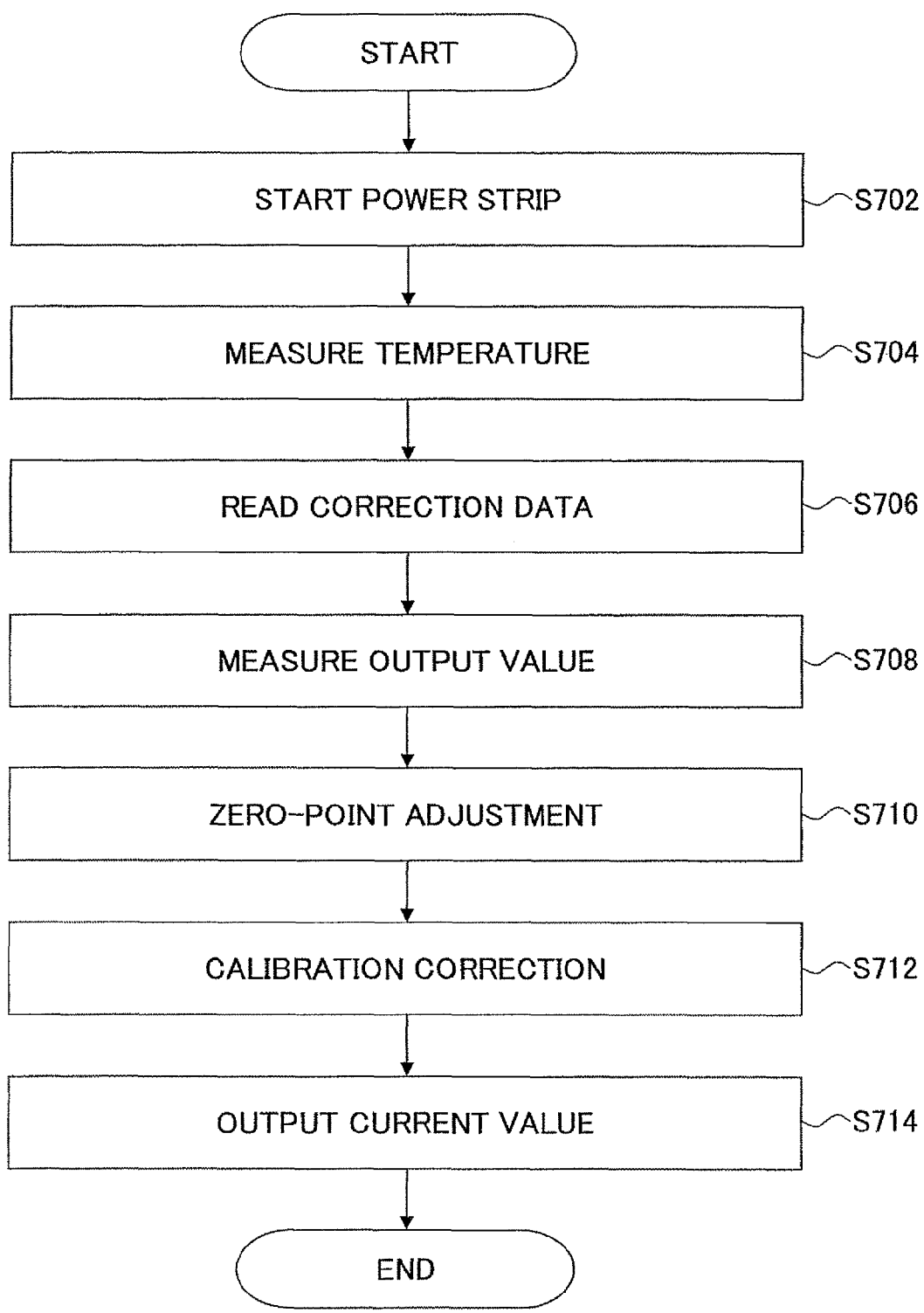
FIG. 14 is a flow chart for explaining the current measuring method in the fourth embodiment.

Next, a description will be given of the current measuring method and the power measuring method in this embodiment, by referring to FIG. 14. The power strip used in the current measuring method and the power measuring method in this embodiment is the power strip forwarded after ending the process of the flow chart illustrated in FIG. 13.

First, in a step S702, the power strip used in this embodiment is started. More particularly, the power strip used in this embodiment is connected to the power supply. For example, when the power strip used in this embodiment is provided with a plug for receiving power via a cable and the like, this plug is connected to a socket that forms the power supply.

Next, in a step S704, the temperature measurement is made in the power strip. More particularly, the temperature measurement is made by the temperature measuring part 80.

Next, in a step S706, the correction data to be used for the calculation are read from the memory part 62 based on the temperature measured by the temperature measuring part 80.

Next, in a step S708, the output voltage values of the Hall elements 42A, 42B, 42C, and 42D are measured. In this state, the currents flowing in the socket parts 10A, 10B, 10C, and 10D are separately measured as the output voltage values of the corresponding Hall elements 42A, 42B, 42C, and 42D, respectively. The output voltage values of the Hall elements 42A, 42B, 42C, and 42D correspond to the currents flowing in the socket parts 10A, 10B, 100, and 10D, respectively. The output voltage values detected by the Hall elements 42A, 42B, 42C, and 42D in this state are stored as V1, V2, V3, and V4, respectively.

Next, in a step S710, a zero-point adjustment is performed. More particularly, differences are obtained between the output voltage values measured in the step S708 and the initial values V10, V20, V30, and V40, respectively. In other words, the zero-point adjustment corresponding to each of the socket parts 10A, 10B, 10C, and 10D is performed by calculating the differences V1-V10, V2-V20, V3-V30, and V4-V40 in the MPU 61.

Next, in a step S712, a calibration correction is performed. More particularly, current values flowing in the socket parts 10A, 10B, 10C, and 10D are calculated in the MPU 61 based on the determinant illustrated in FIG. 8. The determinant illustrated in FIG. 8 may be calculated based on a matrix (matrix that becomes an inverse matrix) P2 that becomes the correction formula, and a matrix P1 having as its elements a product of the zero-point adjustment result calculated in the step S710 and IA. The current values I1, I2, I3, and I4 calculated in this manner are the current values actually flowing in the socket parts 10A, 10B, 10C, and 10D, respectively, and are accurate current values in that the effects from the adjacent socket parts are eliminated.

Next, in a step S714, the current values I1, I2, I3, and I4 calculated in the step S712 are output. More particularly, the current values I1, I2, I3, and I4 are output from the power strip to the computer or the like that is not illustrated, via the communication part 70. The computer may calculate the power consumption at the socket parts 10A, 10B, 10C, and 10D based on the current values I1, I2, I3, and I4 and the voltage applied to the power strip.

The current measuring method and the power measuring method in this embodiment ends after the process described above. According to the current measuring method and the power measuring method in this embodiment, it is possible to accurately know the power consumption of each of the electrical apparatuses and the like connected to the socket parts 10A, 10B, 10C, and 10D, without being dependent upon the temperature of the environment in which the power strip is provided.

Because this embodiment may perform a correction with respect to the temperature dependency of the ferrite core, the power may be measured accurately even in a case in which the temperature of the environment in which the power strip is provided changes.

Features other than those described above for the fourth embodiment are the same as those of the first embodiment described above. In addition, this fourth embodiment may be applied to the second and third embodiments.

[Fifth Embodiment]
(Current Measuring System)

Figure 15:
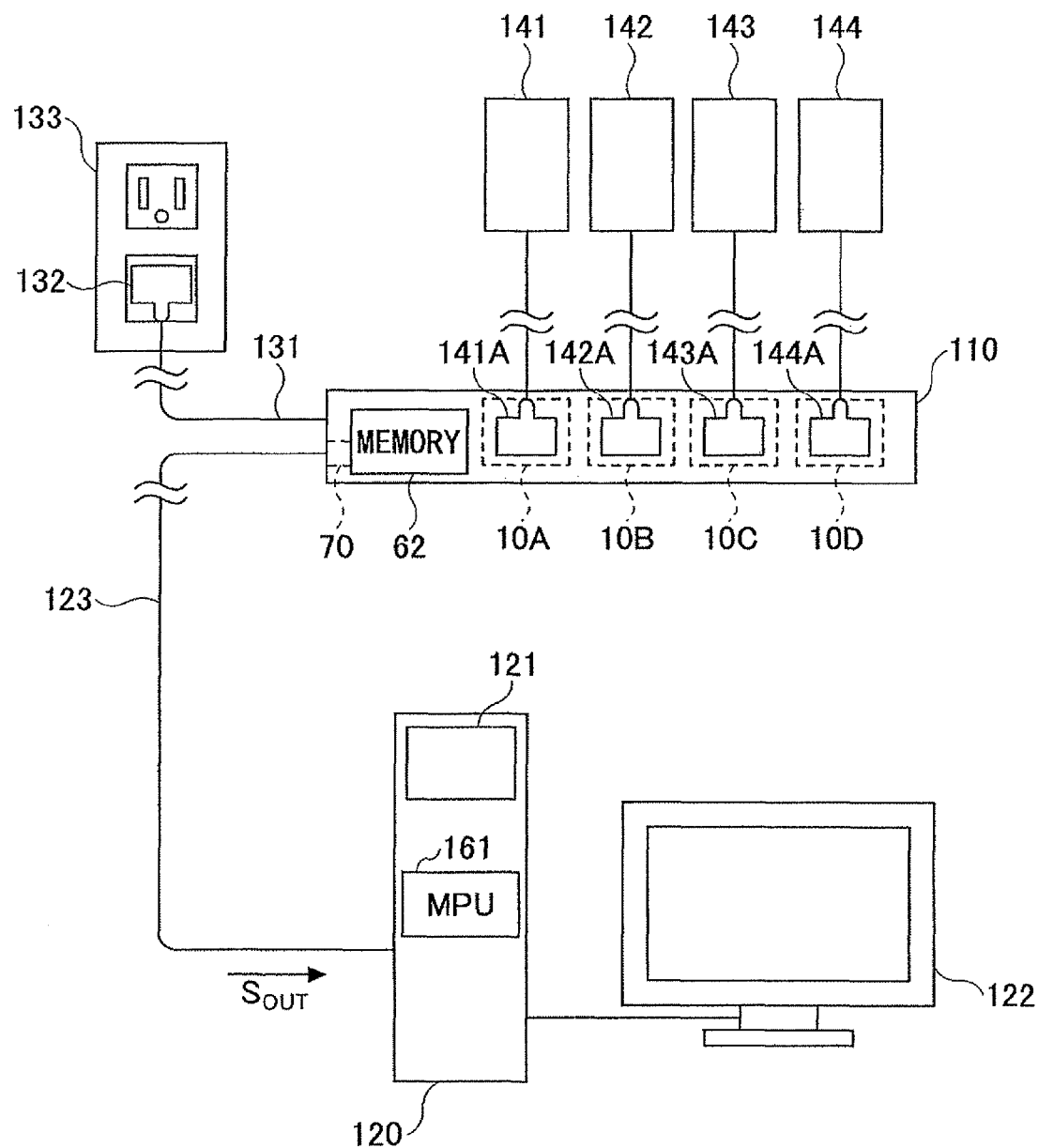
FIG. 15 is a block diagram illustrating a current measuring system in a fifth embodiment.

Next, a description will be given of a fifth embodiment. As illustrated in FIG. 15, a current measuring system in this embodiment includes a power strip 110 and an electronic computing apparatus 120 such as a computer. The power strip 110 in this embodiment has a structure in which the MPU 61 is not provided in the power strip of the first embodiment, and the structure is otherwise the same as that of the power strip of the first embodiment. The power strip 110 in this embodiment is used in a state connected to the electronic computing apparatus 120, and a MPU 161 is provided inside the electronic computing apparatus 120. This MPU 161 has functions similar to those of the MPU 61.

In addition, the power strip 110 and the electronic computing apparatus 120 are connected via a communication cable 123. In other words, the communication part 70 of the power strip 110 and the electronic computing apparatus 120 are connected by the communication cable 123 that enables communication of information, including signals Sout and the like, between the power strip 110 and the electronic computing apparatus 120.

The power strip 110 includes a power cord 131 and a plug 132 connected to the power cord 131. Power may be supplied to the power strip 110 via the power cord 131 by plugging the plug 132 into a power outlet 133 on a wall. The power strip 110 includes socket parts 10A, 10B, 10C, and 10D for receiving plugs, and the plugs of the electrical apparatuses and the like may be plugged into the socket parts 10A, 10B, 10C, and 10D.

More particularly, a plug 141A of a first electrical apparatus 141 is plugged into the socket part 10A of the power strip 110, and a plug 142A of a second electrical apparatus 142 is plugged into the socket part 10B of the power strip 110. In addition, a plug 143A of a third electrical apparatus 143 is plugged into the socket 100 of the power strip 110, and a plug 144A of a fourth electrical apparatus 144 is plugged into the socket part 10D of the power strip 110. Hence, each of the first through fourth electrical apparatuses 141, 142, 143, and 144 may receive the supply of power from the power strip 110. In this state, the current sensor that is not illustrated in FIG. 15 but is provided with respect to each of the socket parts 10A, 10B, 10C, and 10D may measure the current supplied to the corresponding one of the first through fourth electrical apparatuses 141, 142, 143, and 144. The current sensor includes the Hall element.

In addition, a database 121 is provided within the electronic computing apparatus 120, and the total power and the like of the first through fourth electrical apparatuses 141, 142, 143, and 144 within a predetermined time may be stored in the database 121. Moreover, a monitor 122 is connected to the electronic computing apparatus 120, and the power consumption of each of first through fourth electrical apparatuses 141, 142, 143, and 144 may be displayed on the monitor 122. Hence, a user may study reducing the power based on the power consumption displayed on the monitor 122. In FIG. 15, the plugs 141A, 142A, 143A, and 144A are plugged into all of the socket parts 10A, 10B, 10C, and 10D, however, the operation described above is the same when the plugs are plugged into only some of the socket parts 10A, 10B, 10C, and 10D.

(Current Measuring Method and Power Measuring Method)

Next, a description will be given of the current measuring method and the power measuring method in this embodiment, by referring to FIGS. 5 through 8. First, a description will be given of the process up to forwarding of the power strip 110 used in this embodiment, by referring to FIG. 5.

First, in a step S102, the power strip 110 of this embodiment described above is assembled. This power strip 110 includes four socket parts, and the socket parts 10A, 10B, 10C, and 10D may be labeled as 1ch, 2ch, 3ch, and 4ch, respectively.

Next, in a step S104, the assembled power strip 110 is connected to a measuring apparatus. More particularly, a power supply and the measuring apparatus for measuring the current flow and the like are connected to the assembled power strip 110. In this state, an electronic computing apparatus that is not illustrated, for temporarily storing information and performing computations, is also connected to the power strip 110. For example, this electronic computing apparatus may have a structure similar to that of the electronic computing apparatus 120.

Next, in a step S106, the output voltage value of each Hall element is measured for each of the socket parts in a state in which no current flows in each of the socket parts. In other words, in a case in which the current flow is 0 A in each of the socket parts 10A, 10B, 10C, and 10D, the output voltage value of the Hall element provided in each of the current sensors is measured.

Next, in a step S108, the output voltage values in a state in which the current flows in the socket part 1ch are measured. That is, the output voltage values of the Hall elements provided in the current sensors are measured in a state in which the current IA, such as a current of 1 A, for example, is supplied only to the socket part 10A and no current is supplied to the other socket parts 10B, 10C, and 10D.

Next, in a step S110, the output voltage values in a state in which the current flows in the socket part 2ch are measured. That is, the output voltage values of the Hall elements provided in the current sensors are measured in a state in which the current IA, such as the current of 1 A, for example, is supplied only to the socket part 10B and no current is supplied to the other socket parts 10A, 100, and 10D.

Next, in a step S112, the output voltage values in a state in which the current flows in the socket part 3ch are measured. That is, the output voltage values of the Hall elements provided in the current sensors are measured in a state in which the current IA, such as the current of 1 A, for example, is supplied only to the socket part 10C and no current is supplied to the other socket parts 10A, 10B, and 10D.

Next, in a step S114, the output voltage values in a state in which the current flows in the socket part 4ch are measured. That is, the output voltage values of the Hall elements provided in the current sensors are measured in a state in which the current IA, such as the current of 1 A, for example, is supplied only to the socket part 10D and no current is supplied to the other socket parts 10A, 10B, and 10C.

Next, in a step S116, a correction formula is calculated. More particularly, based on the output voltage values measured in each of the steps S106 through S114, a matrix illustrated in FIG. 6 is calculated as the correction formula. The matrix forming the correction formula may be calculated in the electronic computing apparatus that is not illustrated.

Next, correction data are written in a step S118. More particularly, the output voltage values V10, V20, V30, and V40 that are measured in the step S106 and are to be initial values, and the matrix calculated in the step S116 as the correction formula are written in the memory part 62 of the power strip 110.

The power strip 110 of this embodiment is forwarded in the state described above, and thus, the process of the flow chart illustrated in FIG. 5 ends.

Next, a description will be given of the current measuring method and the power measuring method in this embodiment, by referring to FIG. 7. The power strip 110 used in the current measuring method and the power measuring method in this embodiment is the power strip forwarded after ending the process of the flow chart illustrated in FIG. 5.

First, in a step S202, the power strip 110 used in this embodiment is started by connecting the power strip 110 to the power supply. More particularly, the plug 132 of the power strip 110 used in this embodiment is plugged into the power outlet 133 of the wall supplied with the power. In this state, the power strip 110 is connected to the electronic computing apparatus 120 via the communication cable 123.

Next, in a step S204, the correction data are read from the memory part 62. More particularly, the information written in the step S118, that is, the output voltage values V10, V20, V30, and V40 that are to be the initial values, and the matrix forming the correction formula that are stored in the memory part 62 are read by the MPU 161 of the electronic computing apparatus 120.

Next, in a step S206, the output voltage values of the Hall elements 42A, 42B, 42C, and 42D are measured. In this state, the currents flowing in the socket parts 10A, 10B, 10C, and 10D are separately measured as the output voltage values of the corresponding Hall elements 42A, 42B, 42C, and 42D, respectively. The output voltage values of the Hall elements 42A, 42B, 42C, and 42D correspond to the currents flowing in the socket parts 10A, 10B, 100, and 10D, respectively. The output voltage values detected by the Hall elements 42A, 42B, 42C, and 42D in this state are stored as V1, V2, V3, and V4, respectively.

Next, in a step S208, a zero-point adjustment is performed. More particularly, differences are obtained between the output voltage values measured in the step S206 and the initial values V10, V20, V30, and V40, respectively. In other words, the zero-point adjustment corresponding to each of the socket parts 10A, 10B, 10C, and 10D is performed by calculating the differences V1-V10, V2-V20, V3-V30, and V4-V40 in the MPU 161.

Next, in a step S210, a calibration correction is performed. More particularly, current values flowing in the socket parts 10A, 10B, 10C, and 10D are calculated in the MPU 161 based on the determinant illustrated in FIG. 8.

Next, in a step S212, the current values I1, I2, I3, and I4 calculated in the step S210 are output. The electronic computing apparatus 120 may calculate the power consumption at the socket parts 10A, 10B, 10C, and 10D based on the current values I1, I2, I3, and I4 and the voltage applied to the power strip, and display the power consumption on the monitor 122. Hence, it is possible to accurately know the power consumption of each of the electrical apparatuses and the like connected to the socket parts 10A, 10B, 10C, and 10D.

Features other than those described above for the fifth embodiment are the same as those of the first embodiment described above. In addition, this fifth embodiment may be applied to the second through fourth embodiments.

[Sixth Embodiment]
(Current Measuring System)

Figure 16:
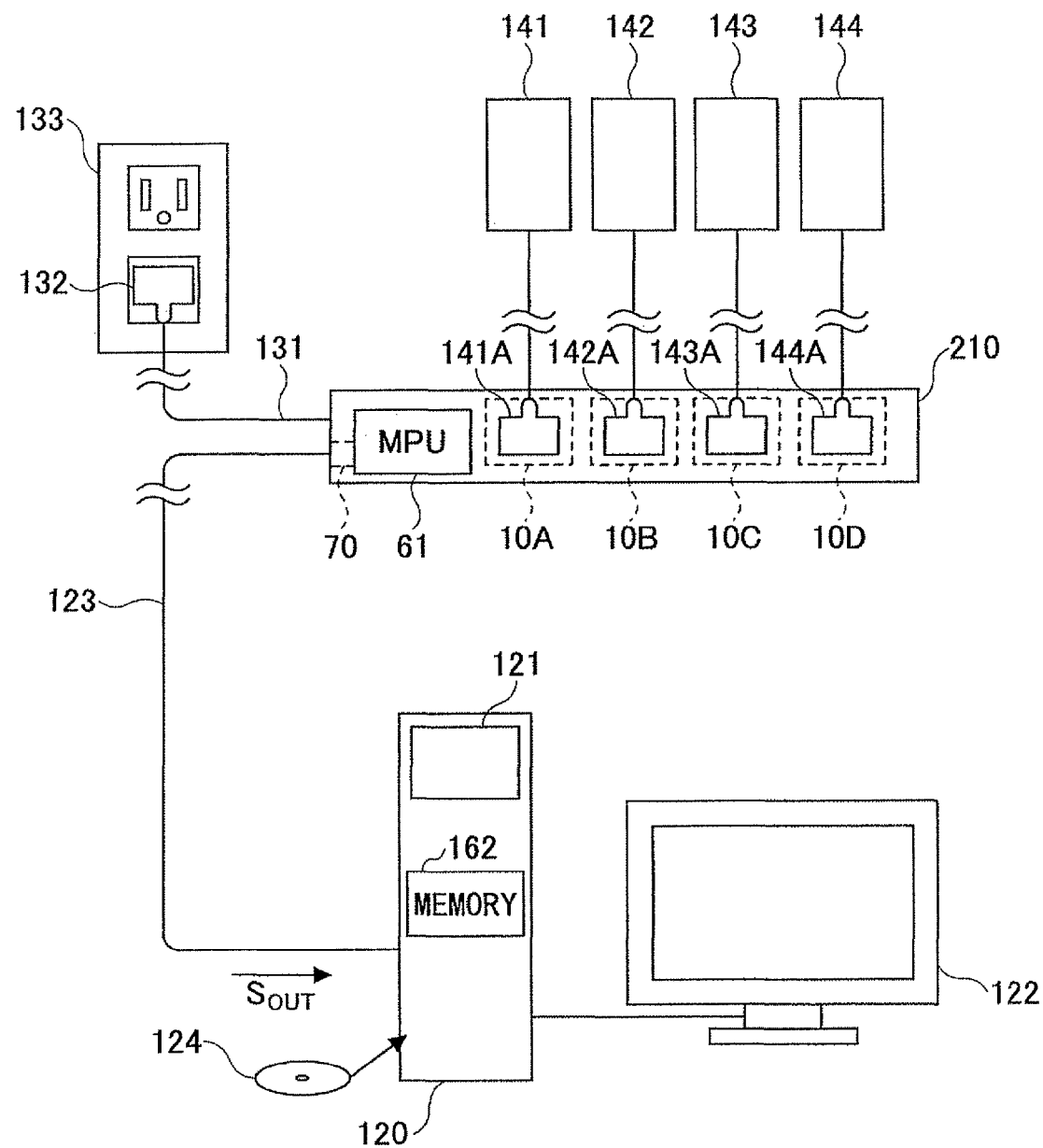
FIG. 16 is a block diagram illustrating the current measuring system in a sixth embodiment.

Next, a description will be given of a sixth embodiment. As illustrated in FIG. 16, a current measuring system in this embodiment includes a power strip 210 and an electronic computing apparatus 120 such as a computer. The power strip 210 in this embodiment has a structure in which the memory part 62 is not provided in the power strip of the first embodiment, and the structure is otherwise the same as that of the power strip of the first embodiment. The power strip 210 in this embodiment is used in a state connected to the electronic computing apparatus 120, and a memory part 162 is provided inside the electronic computing apparatus 120. This memory part 162 has functions similar to those of the memory part 62.

(Current Measuring Method and Power Measuring Method)

Next, a description will be given of the current measuring method and the power measuring method in this embodiment, by referring to FIGS. 5 through 8. First, a description will be given of the process up to forwarding of the power strip 210 used in this embodiment, by referring to FIG. 5.

First, in a step S102, the power strip 210 of this embodiment described above is assembled. This power strip 210 includes four socket parts, and the socket parts 10A, 10B, 10C, and 10D may be labeled as 1ch, 2ch, 3ch, and 4ch, respectively.

Next, in a step S104, the assembled power strip 210 is connected to a measuring apparatus. More particularly, a power supply and the measuring apparatus for measuring the current flow and the like are connected to the assembled power strip 210. In this state, an electronic computing apparatus that is not illustrated, for temporarily storing information and performing computations, is also connected to the power strip 210. For example, this electronic computing apparatus may have a structure similar to that of the electronic computing apparatus 120.

Next, in a step S106, the output voltage value of each Hall element is measured for each of the socket parts in a state in which no current flows in each of the socket parts. In other words, in a case in which the current flow is 0 A in each of the socket parts 10A, 10B, 10C, and 10D, the output voltage value of the Hall element provided in each of the current sensors is measured.

Next, in a step S108, the output voltage values in a state in which the current flows in the socket part 1ch are measured. That is, the output voltage values of the Hall elements provided in the current sensors are measured in a state in which the current IA, such as a current of 1 A, for example, is supplied only to the socket part 10A and no current is supplied to the other socket parts 10B, 100, and 10D.

Next, in a step S110, the output voltage values in a state in which the current flows in the socket part 2ch are measured. That is, the output voltage values of the Hall elements provided in the current sensors are measured in a state in which the current IA, such as the current of 1 A, for example, is supplied only to the socket part 10B and no current is supplied to the other socket parts 10A, 100, and 10D.

Next, in a step S112, the output voltage values in a state in which the current flows in the socket part 3ch are measured. That is, the output voltage values of the Hall elements provided in the current sensors are measured in a state in which the current IA, such as the current of 1 A, for example, is supplied only to the socket part 100 and no current is supplied to the other socket parts 10A, 10B, and 10D.

Next, in a step S114, the output voltage values in a state in which the current flows in the socket part 4ch are measured. That is, the output voltage values of the Hall elements provided in the current sensors are measured in a state in which the current IA, such as the current of 1 A, for example, is supplied only to the socket part 10D and no current is supplied to the other socket parts 10A, 10B, and 100.

Next, in a step S116, a correction formula is calculated. More particularly, based on the output voltage values measured in each of the steps 5106 through 5114, a matrix illustrated in FIG. 6 is calculated as the correction formula. The matrix forming the correction formula may be calculated in the electronic computing apparatus that is not illustrated.

Next, correction data are written in a step S118. More particularly, the output voltage values V10, V20, V30, and V40 that are measured in the step S106 and are to be initial values, and the matrix calculated in the step S116 as the correction formula are written in an external storage medium (external storage medium 124 to be described later). This external storage medium is forwarded as an accessory to the power strip 210 when the power strip 210 is forwarded, and may be formed by an optical disk or the like.

The power strip 210 of this embodiment is forwarded in the state described above, and thus, the process of the flow chart illustrated in FIG. 5 ends.

Next, a description will be given of the current measuring method and the power measuring method in this embodiment, by referring to FIG. 7. The power strip 210 used in the current measuring method and the power measuring method in this embodiment is the power strip forwarded after ending the process of the flow chart illustrated in FIG. 5.

First, in a step S202, the power strip 210 used in this embodiment is started. More particularly, the external storage medium 124 is inserted into the electronic computing apparatus 120, and the output voltage values V10, V20, V30, and V40 that are to be the initial values and the matrix to be the correction formula are read from the external storage medium 124 and stored in the memory part 162 of the electronic computing apparatus 120. In addition, the power strip 210 is connected to the electronic computing apparatus 120 via the communication cable 123, and the power strip 210 is connected to the power supply. The power strip 210 may be connected to the power supply by plugging the plug 132 into the power outlet 133 of the wall supplied with the power.

Next, in a step S204, the correction data are read from the memory part 162. More particularly, the information written in the step 5118, that is, the output voltage values V10, V20, V30, and V40 that are to be the initial values, and the matrix forming the correction formula that are stored in the memory part 162 are read by the MPU 61.

Next, in a step S206, the output voltage values of the Hall elements 42A, 42B, 42C, and 42D are measured. In this state, the currents flowing in the socket parts 10A, 10B, 10C, and 10D are separately measured as the output voltage values of the corresponding Hall elements 42A, 42B, 42C, and 42D, respectively. The output voltage values of the Hall elements 42A, 42B, 42C, and 42D correspond to the currents flowing in the socket parts 10A, 10B, 10C, and 10D, respectively. The output voltage values detected by the Hall elements 42A, 42B, 42C, and 42D in this state are stored as V1, V2, V3, and V4, respectively.

Next, in a step S208, a zero-point adjustment is performed. More particularly, differences are obtained between the output voltage values measured in the step S206 and the initial values V10, V20, V30, and V40, respectively. In other words, the zero-point adjustment corresponding to each of the socket parts 10A, 10B, 10C, and 10D is performed by calculating the differences V1-V10, V2-V20, V3-V30, and V4-V40 in the MPU 61.

Next, in a step S210, a calibration correction is performed. More particularly, current values flowing in the socket parts 10A, 10B, 10C, and 10D are calculated in the MPU 61 based on the determinant illustrated in FIG. 8.

Next, in a step S212, the current values I1, I2, I3, and I4 calculated in the step S210 are output. The electronic computing apparatus 120 may calculate the power consumption at the socket parts 10A, 10B, 10C, and 10D based on the current values I1, I2, I3, and I4 and the voltage applied to the power strip, and display the power consumption on the monitor 122. Hence, it is possible to accurately know the power consumption of each of the electrical apparatuses and the like connected to the socket parts 10A, 10B, 10C, and 10D.

Features other than those described above for the sixth embodiment are the same as those of the first and fifth embodiments described above. In addition, this sixth embodiment may be applied to the second through fourth embodiments.

[Seventh Embodiment]
(Current Measuring System)

Figure 17:
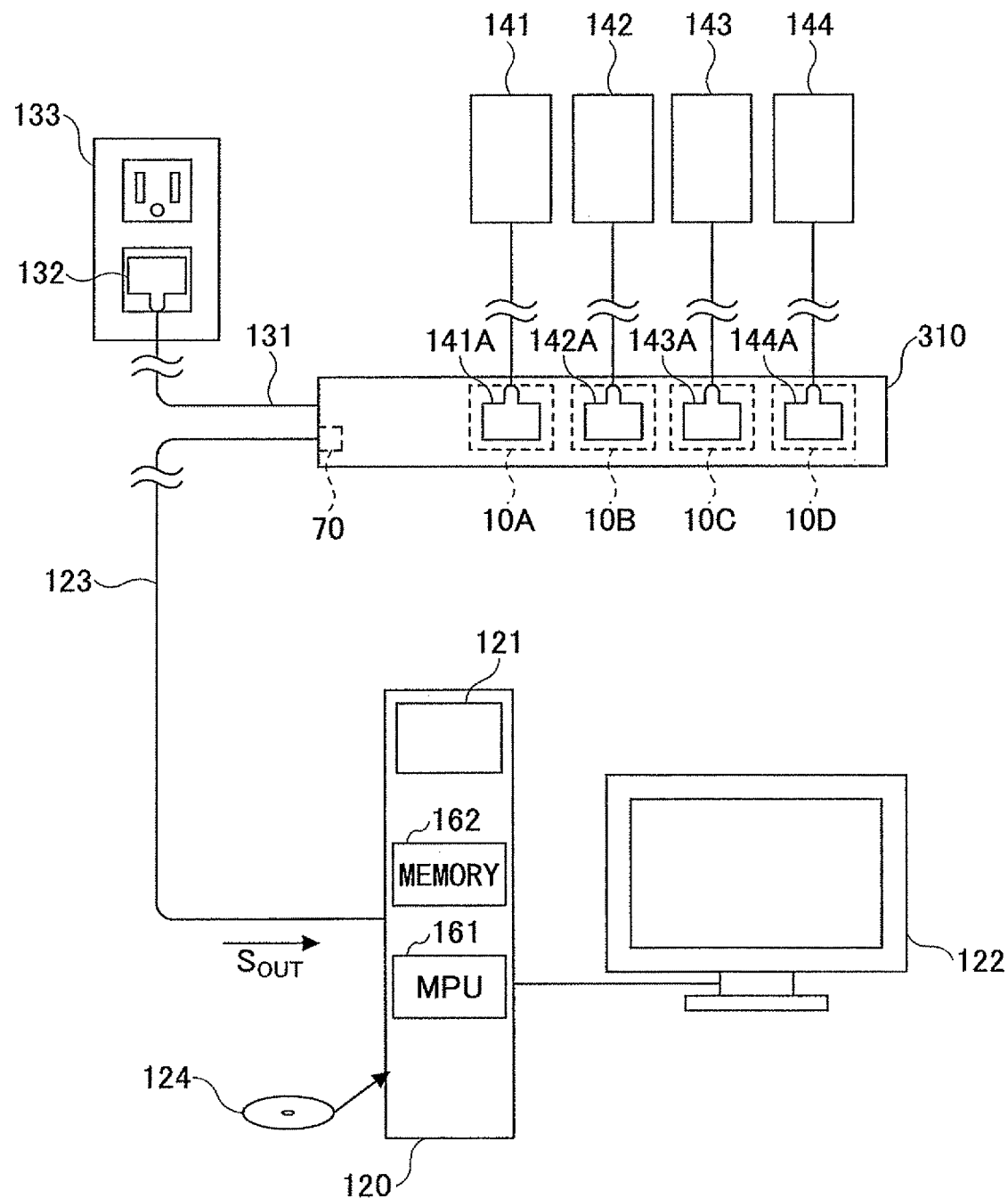
FIG. 17 is a block diagram illustrating the current measuring system in a seventh embodiment.

Next, a description will be given of a seventh embodiment. As illustrated in FIG. 17, a current measuring system in this embodiment includes a power strip 310 and an electronic computing apparatus 120 such as a computer. The power strip 310 in this embodiment has a structure in which the MPU 61 and the memory part 62 are not provided in the power strip of the first embodiment, and the structure is otherwise the same as that of the power strip of the first embodiment. The power strip 310 in this embodiment is used in a state connected to the electronic computing apparatus 120, and a MPU 161 and a memory part 162 are provided inside the electronic computing apparatus 120. The MPU 161 and the memory part 162 have functions similar to those of the MPU 61 and the memory part 62, respectively.

(Current Measuring Method and Power Measuring Method)

Next, a description will be given of the current measuring method and the power measuring method in this embodiment, by referring to FIGS. 5 through 8. First, a description will be given of the process up to forwarding of the power strip 310 used in this embodiment, by referring to FIG. 5.

First, in a step S102, the power strip 310 of this embodiment described above is assembled. This power strip 310 includes four socket parts, and the socket parts 10A, 10B, 10C, and 10D may be labeled as 1ch, 2ch, 3ch, and 4ch, respectively.

Next, in a step S104, the assembled power strip 310 is connected to a measuring apparatus. More particularly, a power supply and the measuring apparatus for measuring the current flow and the like are connected to the assembled power strip 310. In this state, an electronic computing apparatus that is not illustrated, for temporarily storing information and performing computations, is also connected to the power strip 310. For example, this electronic computing apparatus may have a structure similar to that of the electronic computing apparatus 120.

Next, in a step S106, the output voltage value of each Hall element is measured for each of the socket parts in a state in which no current flows in each of the socket parts. In other words, in a case in which the current flow is 0 A in each of the socket parts 10A, 10B, 10C, and 10D, the output voltage value of the Hall element provided in each of the current sensors is measured.

Next, in a step S108, the output voltage values in a state in which the current flows in the socket part 1ch are measured. That is, the output voltage values of the Hall elements provided in the current sensors are measured in a state in which the current IA, such as a current of 1 A, for example, is supplied only to the socket part 10A and no current is supplied to the other socket parts 10B, 10C, and 10D.

Next, in a step S110, the output voltage values in a state in which the current flows in the socket part 2ch are measured. That is, the output voltage values of the Hall elements provided in the current sensors are measured in a state in which the current IA, such as the current of 1 A, for example, is supplied only to the socket part 10B and no current is supplied to the other socket parts 10A, 10C, and 10D.

Next, in a step S112, the output voltage values in a state in which the current flows in the socket part 3ch are measured. That is, the output voltage values of the Hall elements provided in the current sensors are measured in a state in which the current IA, such as the current of 1 A, for example, is supplied only to the socket part 10C and no current is supplied to the other socket parts 10A, 10B, and 10D.

Next, in a step S114, the output voltage values in a state in which the current flows in the socket part 4ch are measured. That is, the output voltage values of the Hall elements provided in the current sensors are measured in a state in which the current IA, such as the current of 1 A, for example, is supplied only to the socket part 10D and no current is supplied to the other socket parts 10A, 10B, and 10C.

Next, in a step S116, a correction formula is calculated. More particularly, based on the output voltage values measured in each of the steps S106 through S114, a matrix illustrated in FIG. 6 is calculated as the correction formula. The matrix forming the correction formula may be calculated in the electronic computing apparatus that is not illustrated.

Next, correction data are written in a step S118. More particularly, the output voltage values V10, V20, V30, and V40 that are measured in the step S106 and are to be initial values, and the matrix calculated in the step S116 as the correction formula are written in an external storage medium (external storage medium 124 to be described later). This external storage medium is forwarded as an accessory to the power strip 310 when the power strip 310 is forwarded.

The power strip 310 of this embodiment is forwarded in the state described above, and thus, the process of the flow chart illustrated in FIG. 5 ends.

Next, a description will be given of the current measuring method and the power measuring method in this embodiment, by referring to FIG. 7. The power strip 310 used in the current measuring method and the power measuring method in this embodiment is the power strip forwarded after ending the process of the flow chart illustrated in FIG. 5.

First, in a step S202, the power strip 310 used in this embodiment is started. More particularly, the external storage medium 124 is inserted into the electronic computing apparatus 120, and the output voltage values V10, V20, V30, and V40 that are to be the initial values and the matrix to be the correction formula are read from the external storage medium 124 and stored in the memory part 162 of the electronic computing apparatus 120. In addition, the power strip 310 is connected to the electronic computing apparatus 120 via the communication cable 123, and the power strip 310 is connected to the power supply. The power strip 310 may be connected to the power supply by plugging the plug 132 into the power outlet 133 of the wall supplied with the power.

Next, in a step S204, the correction data are read from the memory part 162. More particularly, the information written in the step S118, that is, the output voltage values V10, V20, V30, and V40 that are to be the initial values, and the matrix forming the correction formula that are stored in the memory part 162 are read by the MPU 161.

Next, in a step S206, the output voltage values of the Hall elements 42A, 42B, 42C, and 42D are measured. In this state, the currents flowing in the socket parts 10A, 10B, 10C, and 10D are separately measured as the output voltage values of the corresponding Hall elements 42A, 42B, 42C, and 42D, respectively. The output voltage values of the Hall elements 42A, 42B, 42C, and 42D correspond to the currents flowing in the socket parts 10A, 10B, 100, and 10D, respectively. The output voltage values detected by the Hall elements 42A, 42B, 42C, and 42D in this state are stored as V1, V2, V3, and V4, respectively.

Next, in a step S208, a zero-point adjustment is performed. More particularly, differences are obtained between the output voltage values measured in the step S206 and the initial values V10, V20, V30, and V40, respectively. In other words, the zero-point adjustment corresponding to each of the socket parts 10A, 10B, 10C, and 10D is performed by calculating the differences V1-V10, V2-V20, V3-V30, and V4-V40 in the MPU 161.

Next, in a step S210, a calibration correction is performed. More particularly, current values flowing in the socket parts 10A, 10B, 10C, and 10D are calculated in the MPU 161 based on the determinant illustrated in FIG. 8.

Next, in a step S212, the current values I1, I2, I3, and I4 calculated in the step S210 are output. The electronic computing apparatus 120 may calculate the power consumption at the socket parts 10A, 10B, 10C, and 10D based on the current values I1, I2, I3, and I4 and the voltage applied to the power strip, and display the power consumption on the monitor 122. Hence, it is possible to accurately know the power consumption of each of the electrical apparatuses and the like connected to the socket parts 10A, 10B, 10C, and 10D.

Features other than those described above for the seventh embodiment are the same as those of the first and fifth embodiments described above. In addition, this seventh embodiment may be applied to the second through fourth embodiments.

According to the disclosed method of calculating the current correction formula for the power strip, current measuring method, power measuring method, manufacturing method, power strip, and current measuring system, it is possible to accurately measure the current flowing through each of a plurality of electrical apparatuses and the like and the power consumption of each of the plurality of electrical apparatuses and the like.

Although the embodiments are numbered with, for example, "first," "second," . . . "seventh," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of calculating a current correction formula, comprising:

measuring currents flowing in a plurality of socket parts of a power strip by a plurality of current sensors respectively having a ferrite core formed with a gap and a Hall element provided in the gap, wherein the measuring the currents includes detecting a magnetic field generated by the current flowing in each of the plurality of socket parts by the ferrite core of each of the plurality of current sensors, and detecting a voltage value that changes due to the magnetic field by the Hall element of each of the plurality of current sensors;

measuring a temperature by a temperature sensor that is provided in a vicinity of the ferrite core of at least one of the plurality of current sensors;

measuring first voltage values output from each of the plurality of current sensors by a processor in a state in which no current flows in the plurality of socket parts of the power strip, to store the first voltage values in a memory;

measuring second voltage values output from each of the plurality of current sensors by the processor in a state in which a current flows in one of the plurality of socket parts, to store the second voltage values in the memory;

calculating a correction formula formed by an inverse matrix of a matrix having, as elements thereof, differences between the second voltage values and the first voltage values by the processor, to store the correction formula in the memory;

testing the power strip at a plurality of different temperatures that are set by measuring the plurality of different temperatures by the measuring the temperature, so that the measuring the first voltage values, the measuring the second voltage values, and the calculating the correction formula are performed by the processor for each of the plurality of different temperatures that are set, to correct a state of a magnetic flux in the ferrite core of each of the plurality of current sensors depending on each of the plurality of different temperatures;

measuring third voltage values output from each of the plurality of current sensors by the processor in a state in which one or more electrical apparatuses are electrically connected to the power strip; and calculating initial values by the processor from differences between the third voltage values and the first voltage values, to store the initial values in the memory, wherein the initial values and the correction formula, stored in the memory and accessible from outside the power strip, are used to calculate currents flowing in the plurality of socket parts of the power strip.

2. The method of calculating the current correction formula as claimed in claim 1, wherein the first voltage values measured by the measuring the first voltage values are stored in the memory of the power strip.

3. The method of calculating the current correction formula as claimed in claim 2, wherein the correction formula is stored in the memory of the power strip.

4. The method of calculating the current correction formula as claimed in claim 2, wherein the second voltage values measured by the measuring the second voltage values are stored in the memory of the power strip.

5. The method of calculating the current correction formula as claimed in claim 1, wherein the testing the power strip sets the plurality of different temperatures at fixed temperature intervals.

* * * * *